US009319790B2

(12) United States Patent
Morton et al.

(10) Patent No.: US 9,319,790 B2
(45) Date of Patent: Apr. 19, 2016

(54) SYSTEMS AND METHODS OF FREQUENCY RESPONSE CORRECTION FOR CONSUMER ELECTRONIC DEVICES

(71) Applicant: DTS LLC, Calabasas, CA (US)

(72) Inventors: Doug Morton, Huntington Beach, CA (US); James Tracey, Laguna Niguel, CA (US); Alexandra Schoepel, Pasadena, CA (US)

(73) Assignee: DTS LLC, Calabasas, CA (US)

( * ) Notice: Subject to any disclaimer, the term of this patent is extended or adjusted under 35 U.S.C. 154(b) by 616 days.

(21) Appl. No.: 13/727,421

(22) Filed: Dec. 26, 2012

(65) Prior Publication Data

US 2014/0177871 A1 Jun. 26, 2014

(51) Int. Cl.

*H03G 5/00* (2006.01)
*H04R 3/04* (2006.01)
*H04R 29/00* (2006.01)

(52) U.S. Cl.

CPC ................ *H04R 3/04* (2013.01); *H04R 29/008* (2013.01)

(58) Field of Classification Search

CPC ........................................................ H04R 3/04
See application file for complete search history.

(56) References Cited

U.S. PATENT DOCUMENTS

| | | | | |
|---|---|---|---|---|
| 5,406,634 | A | 4/1995 | Anderson et al. | |
| 5,572,443 | A | 11/1996 | Emoto et al. | |
| 8,077,880 | B2 | 12/2011 | Bharitkar et al. | |
| 8,194,874 | B2 | 6/2012 | Starobin et al. | |
| 2005/0069153 | A1 | 3/2005 | Hall et al. | |
| 2005/0119879 | A1 | 6/2005 | Sung et al. | |
| 2006/0004583 | A1 | 1/2006 | Herre et al. | |
| 2007/0033021 | A1 * | 2/2007 | Lin et al. | 704/229 |
| 2009/0316930 | A1 * | 12/2009 | Horbach et al. | 381/99 |
| 2011/0038490 | A1 | 2/2011 | Yang et al. | |
| 2011/0096933 | A1 | 4/2011 | Eastty | |
| 2011/0135103 | A1 | 6/2011 | Sun et al. | |
| 2011/0137643 | A1 * | 6/2011 | Yamanashi et al. | 704/203 |
| 2011/0238426 | A1 | 9/2011 | Fuchs | |
| 2011/0274281 | A1 | 11/2011 | Brown et al. | |
| 2011/0274292 | A1 * | 11/2011 | Fukuda et al. | 381/98 |
| 2013/0096926 | A1 | 4/2013 | Maling, III et al. | |
| 2013/0097510 | A1 | 4/2013 | Maling, III et al. | |
| 2013/0114830 | A1 * | 5/2013 | Eastty | 381/98 |

OTHER PUBLICATIONS

SRS PureSound TV Audio Enhancement (Jan. 11, 2012) in 1 page. Retrieved from http://www.hometheater.com/content/srs-puresound-tv-audio-enhancement.

(Continued)

*Primary Examiner* — Davetta W Goins
*Assistant Examiner* — James Mooney
(74) *Attorney, Agent, or Firm* — Knobbe Martens Olson & Bear LLP

(57) ABSTRACT

Frequency response correction systems and methods for consumer electronic (CE) devices are disclosed. Applying one or more of disclosed techniques can improve a consumer's listening experience. The frequency response of a CE device can be corrected to remove or attenuate salient, undesirable features of with minimal user interaction. Audio quality can be tuned for optimal or near optimal performance even at maximum or near maximum volume levels substantially without fluctuations, clipping, or any other distortions. In some embodiments, audio response of the CE device can be captured, smoothed, and corrected. Correction parameters can be stored on the CE device.

24 Claims, 15 Drawing Sheets

(56) References Cited

OTHER PUBLICATIONS

ARC System 2 Advanced Room Correction System (retrieved on Oct. 16, 2012) in 5 pages.
Karjalainen et al. "About Room Response Equalization and Dereverberation" *Workshop on Applications of Signal Processing to Audio and Acoustics* (2005), pp. 183-186.
Ramos et al., "Filter Design Method for Loudspeaker Equalization Based on IIR Parametric Filters" *Journal of the Audio Engineering Society* 54:12 (2006), pp. 1162-1178.
REW Room EQ Wizards (2011), retrieved from www.hometheatershack.com/roomeq/, in 4 pages.
Step-by-Step Setup guide to Room EQ Wizard (Jan. 22, 2012) in 8 pages.

* cited by examiner

SYSTEMS AND METHODS OF FREQUENCY RESPONSE CORRECTION FOR CONSUMER ELECTRONIC DEVICES

BACKGROUND

Consumer electronic devices, such as audio equipment and televisions, are often designed so that the quality of acoustic reproduction is balanced against aesthetic design choices, size, space, cost, the quality of the speakers, and the like. As a result of such tradeoffs, the quality of acoustic reproduction may deviate negatively from a desired quality level. For example, a composite frequency response of a consumer electronic device, such as a television, tends to deviate from a desired frequency response. Such deviations may be caused by the presence of components other than the speakers, such as a bezel, grill, etc., and the negative effect that such additional components may have on the sound reproduction capabilities of the electronic device. Additionally, consumer electronics manufacturers tend to measure the frequency response of the device in a non-anechoic chamber. This results in a less than accurate correction that is only valid for the room the manufacturer made the measurement in.

SUMMARY

In certain embodiments, a method of correcting frequency response of an electronic device can include capturing an audio signal output by the electronic device. Capturing can include converting the audio signal into a plurality of sound intensity values. The method can include smoothing the captured audio signal to remove or attenuate one or more signal distortions. The smoothing can include dividing the captured audio signal into a plurality of blocks, determining a plurality of mean audio signal intensities corresponding to the plurality of blocks, and adjusting the audio signal based on the determined plurality of mean audio signal intensities. The method can include determining, based at least in part on the smoothed captured audio signal, one or more frequency response correction parameters, the one or more frequency response correction parameters including finite impulse response filter parameters. The method can also include electronically transmitting the one or more frequency response correction parameters to the electronic device, thereby enabling the electronic device to apply the one or more frequency response correction parameters to a subsequent audio signal.

In certain implementations, the method can convert the captured audio signal into a frequency domain. Smoothing the captured audio signal can include, for each block in the plurality of blocks of the captured audio signal, grouping the sound intensity values into a plurality of bands, determining a plurality of first mean sound intensity values corresponding to the plurality of bands, and adjusting the captured audio signal based on the determined plurality of first mean sound intensity values. Adjusting the captured audio signal can include setting the sound intensity values associated with a band to the first mean sound intensity value corresponding to the band. Nonlinear grouping can be performed, and nonlinear grouping can be performed according to a logarithmic spacing along a frequency axis. Smoothing the captured audio signal can also include determining a plurality of second mean sound intensity values corresponding to a sound intensity value and one or more neighboring sound intensity values and adjusting the captured audio signal based on the determined plurality of second mean sound intensity values. Adjusting the captured audio signal can include setting a sound intensity value to the corresponding second mean sound intensity value. The number of neighboring sound intensity values in the one or more neighboring sound intensity values can be determined nonlinearly. In addition, the method can determine infinite impulse response filter parameters. Also, the method can output a user interface having functionality that enables a user to adjust one or more parameters associated with smoothing the captured audio signal.

In various embodiments, an apparatus for correcting frequency response of an electronic device can include a correction determination module that includes one or more processors. The correction determination module can be configured to convert an audio signal into a plurality of sound intensity values and smooth the audio signal to remove or attenuate one or more signal distortions to produce a smoothed audio signal. Smoothing can include, at least, dividing the audio signal into a plurality of blocks, determining a plurality of mean audio signal intensities corresponding to the plurality of blocks, and adjusting the audio signal based on the determined plurality of mean audio signal intensities. The correction determination module can also be configured to receive correction input from a user, the correction input including one or more parameters for a magnitude correction of at least a portion of the frequency response of the smoothed audio signal, calculate, based at least in part on the smoothed audio signal and the correction input, one or more frequency response correction parameters, and provide the one or more frequency response correction parameters to the electronic device In certain implementations, the correction determination module can convert the audio signal into frequency domain. Smoothing the audio signal can include, for each block in the plurality of blocks of the audio signal, grouping the sound intensity values into a plurality of bands, determining a plurality of first mean sound intensity values corresponding to the plurality of bands, and adjusting the audio signal based on the determined plurality of first mean sound intensity values. Adjusting the audio signal can include setting the sound intensity values associated with a band to the first mean sound intensity value corresponding to the band. Nonlinear grouping can be performed, and nonlinear grouping can be performed according to a logarithmic spacing along a frequency axis. Smoothing the audio signal can also include determining a plurality of second mean sound intensity values corresponding to a sound intensity value and one or more neighboring sound intensity values and adjusting the audio signal based on the determined plurality of second mean sound intensity values. Adjusting the audio signal can include setting a sound intensity value to the corresponding second mean sound intensity value. The number of neighboring sound intensity values in the one or more neighboring sound intensity values can be determined nonlinearly. In addition, the correction determination module can determine at least one of finite impulse response filter parameters and infinite impulse response filter parameters.

In some embodiments, an apparatus for correcting frequency response of an electronic device includes one or more processors configured to smooth an input audio signal to attenuate one or more signal distortions in the input audio signal to produce a smoothed audio signal and output a graphical representation of a frequency response of the smoothed audio signal for presentation to a user. The one or more processors can be configured to receive correction input from the user, the correction input including one or more parameters for a magnitude correction of at least a portion of the frequency response of the smoothed audio signal. The one or more processors can also be configured to calculate, based at least in part on the correction input, one or more frequency response correction parameters to be applied by an electronic device.

In certain implementations, the electronic device can include one or more processors. The one or more processors can be configured to smooth the input audio signal by grouping a plurality of sound intensity values of the input audio signal into a plurality of bands, determining a plurality of first mean sound intensity values corresponding to the plurality of bands, and adjusting the input audio signal based on the determined plurality of first mean sound intensity values. Adjusting the input audio signal based on the determined plurality of first mean sound intensity values can include setting the sound intensity values associated with a band to the first mean sound intensity value corresponding to the band. The one or more processors can also be configured to smooth the input audio signal by determining a plurality of second mean sound intensity values corresponding to a sound intensity value and one or more neighboring sound intensity values and adjusting the input audio signal based on the determined plurality of second mean sound intensity values. A number of neighboring sound intensity values in the one or more neighboring sound intensity values can be determined nonlinearly. Adjusting the input audio signal can include setting a sound intensity value to the corresponding second mean sound intensity value.

For purposes of summarizing the disclosure, certain aspects, advantages and novel features of the inventions have been described herein. It is to be understood that not necessarily all such advantages may be achieved in accordance with any particular embodiment of the inventions disclosed herein. Thus, the inventions disclosed herein may be embodied or carried out in a manner that achieves or optimizes one advantage or group of advantages as taught herein without necessarily achieving other advantages as may be taught or suggested herein.

BRIEF DESCRIPTION OF THE DRAWINGS

Throughout the drawings, reference numbers may be re-used to indicate correspondence between referenced elements. The drawings are provided to illustrate embodiments of the inventions described herein and not to limit the scope thereof.

DETAILED DESCRIPTION

Overview

Figure 1A:
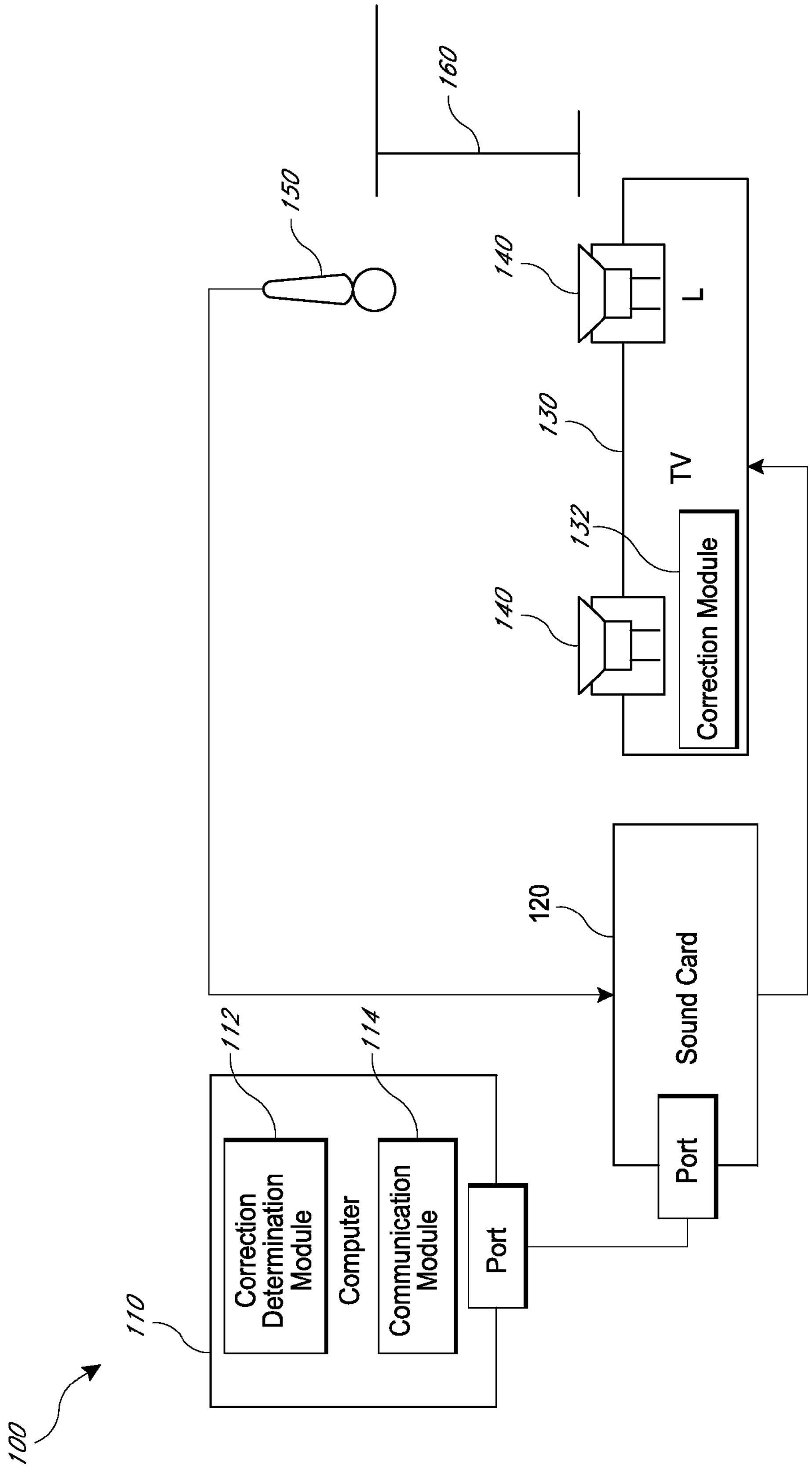
FIG. 1A illustrates an embodiment of a frequency response correction system in combination with a consumer electronic device.

Consumer electronic (CE) devices, such as flat panel televisions, are often designed so that the quality of acoustic reproduction is balanced against aesthetic design choices, size, space, cost, speaker quality, and the like. As a result of such tradeoffs, the acoustic quality may deviate negatively from a desired quality level. For example, a composite frequency response of a consumer electronic device, such as a television, tends to deviate from a desired frequency response. Such deviations may be caused by the presence of components other than the speakers, such as a bezel, grill, etc., and the negative effect that such additional components may have on the sound reproduction capabilities of the electronic device. Additionally, a flat panel television manufacturer may measure and tune the frequency response of the television in a non-anechoic chamber. For example, early reflections, room nodes, and reverberation may be introduced into an acoustic capture and distort the measurement of the frequency response. Additionally consumer placement of a product can also interfere with sound quality. As a result, reflections in a room where the television is set-up by a consumer can alter the perceived frequency response and negatively affect the acoustic quality. These drawbacks may be especially undesirable when the television is configured to provide surround sound. Multiple corrections could be generated by the manufacturer to address typical positioning of the CE device.

This disclosure describes certain systems and methods for frequency response correction of consumer electronic devices. Techniques used by these systems and methods can include capturing the audio response of a CE device and correcting the audio response. Correction can be performed using finite impulse response (FIR) filter correction, infinite impulse response (IIR) filter correction, and/or a combination of FIR and IIR filter correction. Additional techniques can include smoothing of the captured audio response to remove or attenuate undesirable portions and/or removal of notches from the captured response. Determined frequency response correction parameters can be provided to and/or stored in the CE device. Frequency response corrections parameters can include parameters of one or more filters that can be implemented in the time domain or in the frequency domain. Moreover, a user interface for performing frequency response correction can be provided.

Advantageously, in certain embodiments, applying one or more of these techniques can improve a consumer's listening experience. Audio quality can be tuned for optimal or near optimal performance even at maximum or near maximum volume levels substantially without fluctuations, clipping, or any other distortions. The corrected audio response can also provide an optimal or near optimal tone balancing. In addition, the audio quality can be adjusted to suit preferences of a given consumer, which may be based, for example, on the acoustics of the environment where the CE device is used. The acoustic response can be corrected to remove or attenuate salient, undesirable features of the frequency response of the CE device with minimal user interaction. Distortions due to the environment where the CE device is used may be attenuated or disregarded. Frequency response can be corrected to produce a bass response that exceeds even the low frequency limitations of the speakers and/or headphones.

Overview of Frequency Response Correction System

Referring to FIG. 1A, an embodiment of a frequency response correction system 110 in combination with a CE device 130 is shown. The combination 100 includes a microphone 150 configured to detect sound produced by one or more speakers 140 of the CE device 130. The CE device 130 can be a television. As is illustrated, the CE device 130 includes left and right speakers 140 (left speaker is designated with "L"). The microphone 150 can be positioned at a distance 160 from the one or more speakers 140, and can be configured to capture sound produced by the one or more speakers 140. In one embodiment, distance 160 can be up to 1 meter in front of the one or more speakers 140. For example, the microphone 150 can be positioned about 1 meter away from the left speaker 140. If the CE device 140 is placed on a stand, the microphone 150 can be placed on the stand about 1 meter in front of the left speaker 140. Further, the microphone 150 can be positioned at a certain height in relation to the bottom edge of the one or more speakers 140. In one embodiment, the microphone 150 can be positioned about 0-10 cm above the bottom edge of the left speaker 140. In one embodiment, if frequency response correction obtained from the microphone 150 positioned at a certain distance 160 is inadequate, the microphone 150 can be moved to a new distance about 10-20 cm away from its previous position and the correction can be performed again.

The correction system 110 includes a correction determination module 112 and a communication module 114. The correction system 110 can be any suitable computing device, such as a stationary or portable computer, tablet, PDA, mobile smartphone, and the like. The correction determination module 112 is configured to perform frequency response correction. The communication module 114 is configured to communicate with the CE device 130, including sending data to and/or receiving data from the CE device. In the embodiment illustrated in FIG. 1A, the communication module 114 communicates with the CE device 130 through a sound card 120, which can be configured to provide and/or capture audio. For example, the sound card 120 can communicate with the CE device via an audio input channel. The communication module 114 can communicate with the sound card 120 through a suitable port, such as serial, parallel, USB, and the like. In some embodiments, the sound card 120 can be internal to the correction system 110. In certain embodiments, a wireless communication path can be used between the correction system 110 and the CE device 130. In the illustrated embodiment, the microphone 150 is connected to the sound card 120, such as to an audio input channel of the sound card.

The CE device 130 includes a correction module 132 configured to apply frequency response correction determined by the correction determination module 112. In one embodiment, the correction system 110 can communicate frequency response correction parameters to the CE device 130 and receive parameters from the CE device using systems and methods disclosed in U.S. application Ser. No. 13/592,181, filed Aug. 22, 2012, titled "Audio Adjustment System," and/or U.S. application Ser. No. 13/592,182, filed Aug. 22, 2012, titled "Audio Adjustment System," the disclosures of which are incorporated by reference in their entireties and form a part of this specification. For example, the correction system 110 can electronically transmit one or more frequency response correction parameters to the CE device 130 through an audio port on the CE device 130 or through another electronics port, or even wirelessly. Any of a variety of protocols may be used to perform this data transfer, including audio-frequency shift keying (AFSK) or the like. The correction can then be stored on the CE device. For example, the correction can be stored by the correction module 132.

In other embodiments, the correction determination module 112 may be stored directly in memory of the CE device 130. The correction system 110 can access the correction determination module 112 over an electronic (wired or wireless) connection to the CE device 130. Thus, the correction system 110 can be a thin client or the like that allows a user to access the functionality of the correction determination module 112 in the CE device 130. In yet another embodiment, the CE device 130 may allow direct interaction with the correction determination module 112 without the use of a separate device such as the correction system 110. If the CE device 130 were a TV, for instance, the TV may output a user interface that can enable a user to control the correction determination module 112 via a remote control or other peripheral(s) (such as a mouse and/or keyboard) that are compatible with the TV.

Figure 1B:
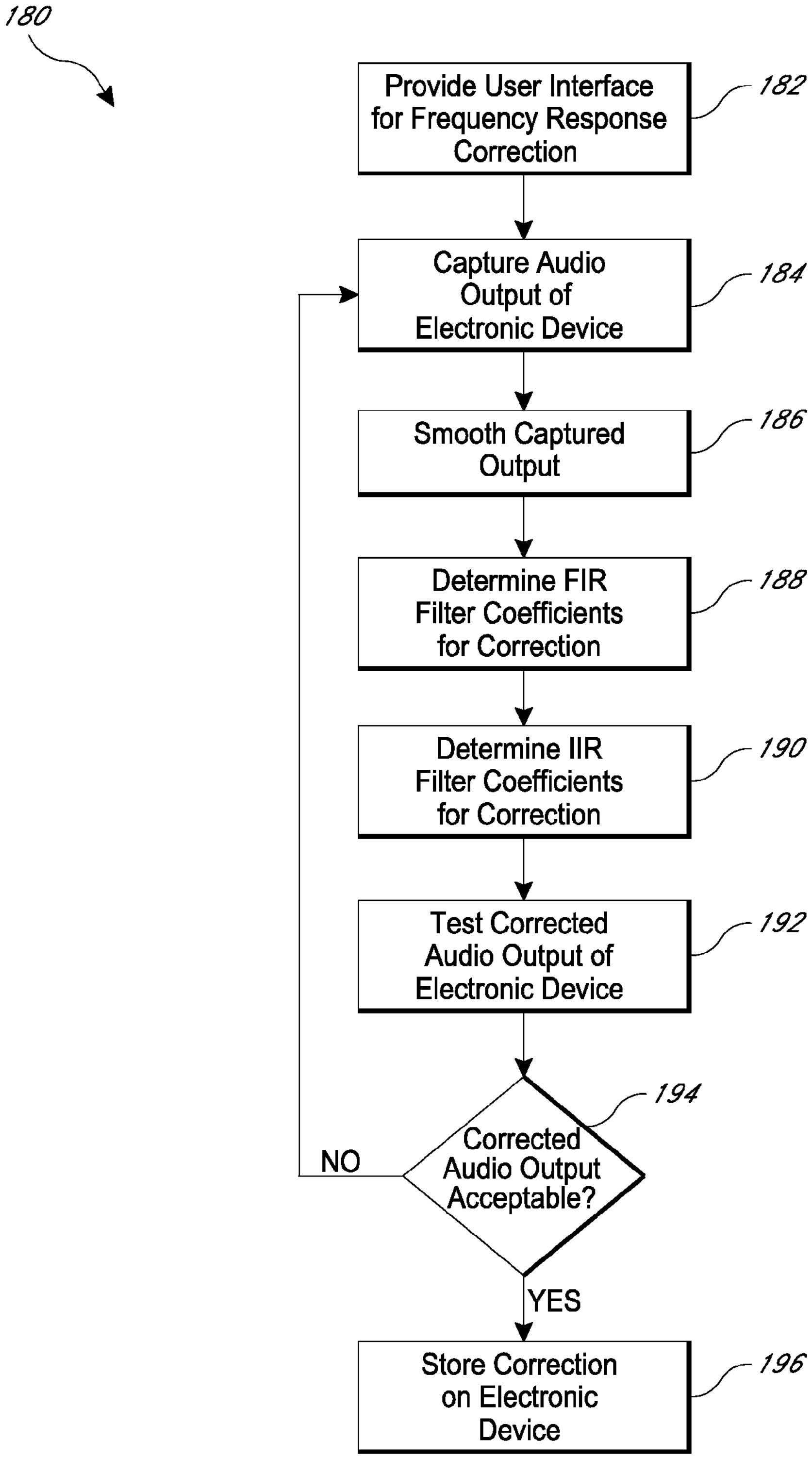
FIG. 1B illustrates an embodiment of a frequency response correction process.

FIG. 1B illustrates an embodiment of a frequency response correction process 180. The process 180 can be implemented by the frequency response correction system 110 and/or the correction determination module 112 and/or the communication module 114. The process 180 begins in block 182 where it provides a user interface for the frequency response correction. The process 180 transitions to block 184 where it captures audio output of a CE device (e.g., CE device 130). In one embodiment, capturing the audio output includes digitizing the audio output to determine a plurality of sound intensity values, audio intensity values, sound pressure values, etc. After the audio output has been captured, the process 180 transitions to block 186 where it performs smoothing of the captured output. The process 180 transitions to block 188 where it determines FIR correction. For example, the process 180 can determine FIR filter coefficients for FIR correction. The process 180 transitions to block 190 where it determines IIR correction. For example, the process 180 can determine IIR filter coefficients for IIR correction.

In one embodiment, a combination of FIR and IIR filter coefficients forms the frequency response correction. In block 192, the process 180 performs a test of the corrected audio output using the determined frequency response correction. In one embodiment, the test is a listening test. In block 194, the process 180 determines whether the corrected audio output is acceptable or satisfactory. In case the process 180 determines that the corrected audio output is not acceptable, the process 180 transitions to block 184 where another capture is performed. In one embodiment, the microphone 150 can be moved to a new distance about 10-20 cm away from the previous position. If the process 180 determines that the corrected audio output is acceptable, the process transitions to block 196 where it stores the correction on the CE device.

FIR Frequency Response Correction

Figure 2:
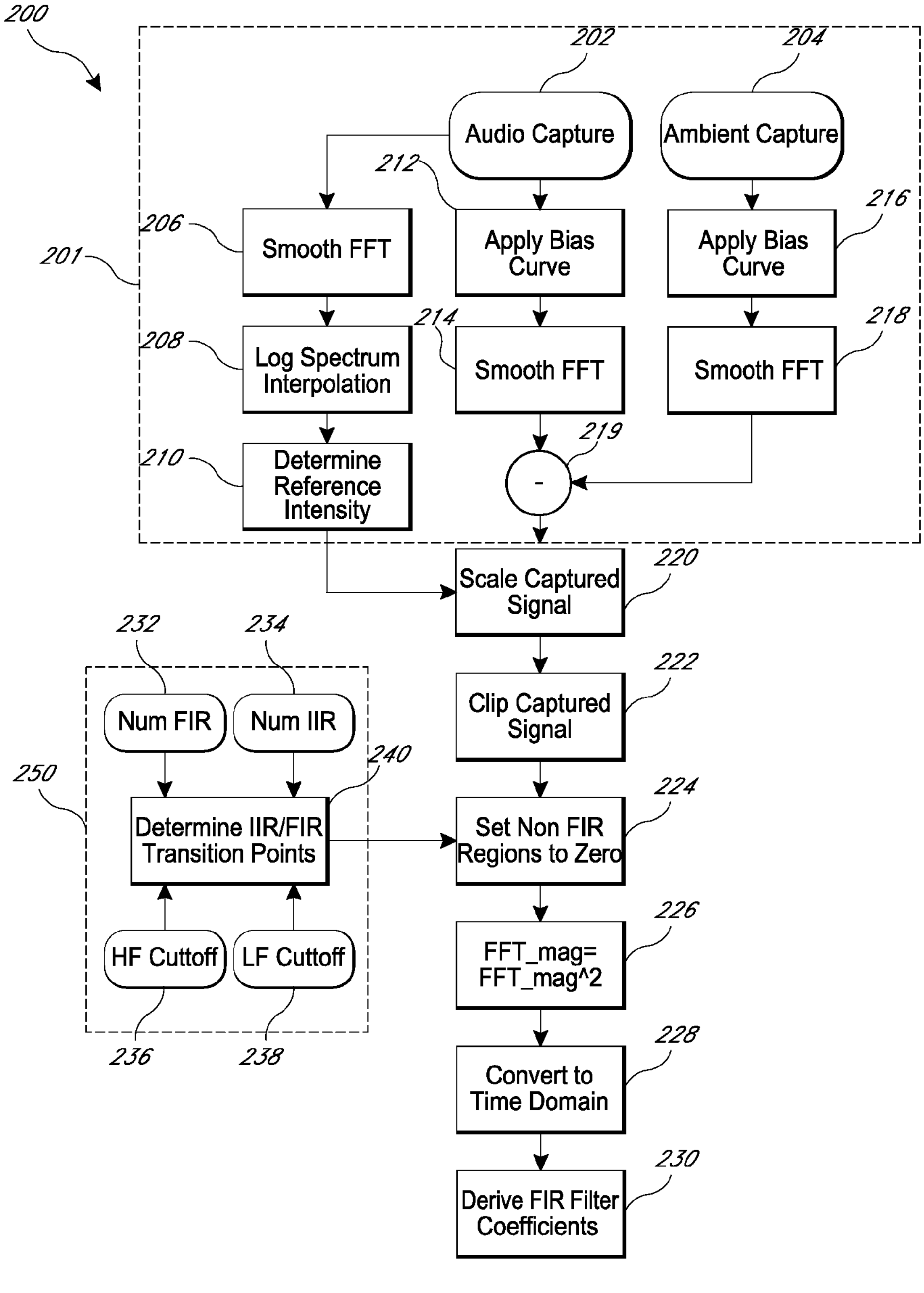
FIG. 2 illustrates an embodiment of frequency response correction process using finite impulse response (FIR) filter(s)

FIG. 2 illustrates an embodiment of frequency response correction process 200 that uses FIR filter(s). In some embodiments, FIR filters can be designed to produce a minimum phase response, which can be advantageous for improving the quality of corrected audio response. The process 200 can be executed by the correction determination module 112.

In block 202, the process 200 performs a capture of an audio response of a CE device, such as CE device 130. Capture can be performed using the microphone 150. The CE device can be provided (or stimulated) with one or more test audio sequence suitable for capture and subsequent processing. The CE device can be configured to play back the one or more test audio sequence. In one embodiment, the one or more test audio sequence is provided to the CE device via the sound card 120. In one embodiment, a colored (e.g., pink) noise test audio sequence is used. The power spectrum of pink noise is inversely proportional to the frequency. In another embodiment, a maximum length sequence (MLS) can be used as a test audio sequence. In yet another embodiment, any suitable test sequence or combination of test sequences can be used during audio response capture. Captured audio response can be converted into frequency domain utilizing, for example, the Fast Fourier Transform (FFT). In one embodiment, the process 200 can operate on segments (or frames) of the captured audio signal. The segments can be overlapping or non-overlapping, and may be obtained by windowing the captured audio signal.

In block 212, the process 200 can apply a biasing curve to the captured audio response. For example, applying the biasing curve can emphasize and/or deemphasize one or more frequency regions. Selecting or creating a suitable biasing curve can allow a user to specify a desired shape of the corrected frequency response. For instance, a user can select a preset bias curve or combination of preset bias curves, such as rock, jazz, pop, vocal, dance, concert, etc. or design a custom bias curve. In one embodiment, if the user does not select or specify the biasing curve, the process 200 uses a flat biasing curve having magnitude equal to one across the entire frequency spectrum. In block 214, as is described below, the process 200 performs smoothing of the audio capture. In one embodiment, block 214 also converts the captured audio signal into frequency domain, such as by taking the FFT, and performs the smoothing in the frequency domain.

In one embodiment, capture of the audio response of one or more speakers 140 can be performed. For example, capture of the audio response of the left speaker 140 can be performed. In another embodiment, capture of the audio response of each of the speakers 140 can be performed. For example, capture of the audio response of the left and right speakers 140 can be performed.

In one embodiment, the process 200 can remove or attenuate frequency magnitude distortions due to ambient conditions. For example, the process 200 can remove or attenuate background sounds or noise. In block 204, the process 200 can capture ambient conditions (or ambient noise). Biasing of the captured ambient conditions can be performed in block 216, and the captured ambient conditions can be smoothed in block 218. In one embodiment, captured ambient conditions can be processed, such as biased and smoothed, using the same parameters applied to the audio response capture in blocks 212 and 214. The captured (and processed) ambient conditions can be subtracted from the captured audio response in block 219 so that these distortions are removed or attenuated from the captured audio response.

Captured audio response of block 202 can be smoothed in block 206 and interpolated in block 208. The interpolation can be performed in a logarithmic domain whereby the intensity or magnitude of the frequency spectrum of the captured audio signal is converted to logarithmic domain. In block 210, the process 200 determines a reference intensity by processing the captured audio response interpolated in the logarithmic domain. For example, the processing can involve averaging the magnitudes of the captured audio response in a frequency range, such as between 400 Hz and 5 kHz. In some embodiments, averaging can be performed over the entire frequency spectrum of the captured audio response or over any suitable frequency range. In one embodiment, the lower cutoff frequency of the frequency range can correspond to the corner frequency of the speakers (or −3 dB frequency). In one embodiment, the reference intensity corresponds to the baseline of the frequency response of the captured audio response. For example, the baseline can be the zero decibel (dB) point. In one embodiment, a user can adjust the determined reference intensity.

In block 220, the process 200 can scale the captured audio response using the determined reference intensity. In one embodiment, scaling can be performed by dividing the captured audio response output by block 219 by the reference intensity. For example, when the reference intensity is a zero dB point, the captured audio response output by block 219 can be divided by a linear (non-logarithmic) equivalent of the zero dB point. This can result in centering the response around the reference intensity.

In block 222, the scaled captured audio response can be clipped. In one embodiment, a user can specify minimum and/or maximum allowed gains, and the signal is adjusted (or limited) so that it satisfies these gains. Clipping can be advantageous for preventing excessive gain (or intensity) removal from the audio signal when frequency response correction is applied, preventing overcorrection of the frequency response, and the like.

In block 224, the process 200 can exclude from FIR correction one or more regions. In one embodiment, one or more frequency ranges not subject to FIR frequency response correction can be set to the reference intensity, such as the zero dB point (or the linear equivalent of the zero dB point). In one embodiment, because a lower frequency region, such as region below about 500-600 Hz, may be more efficiently corrected using IIR frequency response correction, this region can be excluded from FIR correction. For example, a non-warped FIR filter may be less efficient at correcting the response at lower frequencies than an IIR filter. As another example, an FIR filter without a large number of coefficients (or taps) may lack the resolution for performing frequency response correction at lower frequencies. Accordingly, it may be advantageous to set low frequency regions to the zero dB point and perform IIR filter correction in those regions.

Block 224 accepts input from block 250 that is configured to determine the lowest frequency corrected by the FIR response correction. This lowest frequency can be referred to as FIR/IIR crossover frequency. In one embodiment, block 250 determines the FIR/IIR crossover frequency in block 240, which can use the following parameters. The highest or maximum correction frequency of the system is set in block 236, and can be selected by the user. For example, the highest correction frequency can be about 15 kHz. The lowest or minimum correction frequency of the system is set in block 238, and can be selected by the user. For example, the lowest correction frequency can be about 100-200 Hz. In one embodiment, the lowest and/or highest correction frequencies can represent correction frequency thresholds of the entire frequency response correction system, which can include both FIR and IIR frequency correction. The number of FIR filter coefficients (or taps) is set in block 232, and the number of IIR bands is set in block 234. These values can also be set or selected by the user.

Block 240 determines the FIR/IIR crossover frequency. In one embodiment, the crossover frequency is not a fixed value. As the number of FIR filter coefficients reduces, the lowest frequency that can be efficiently corrected increases. In addition, using an FIR filter with a large number of coefficients can be computationally intensive. Accordingly, there is a tradeoff between the FIR filter length and the lowest frequency that can be efficiently corrected. For example, a 257 coefficient (or tap) FIR filter may lose its effectiveness at around 600 Hz. As another example, a 50 coefficient (or tap) FIR filter may lose its effectiveness at around 4000 Hz. In one embodiment, when IIR frequency correction is performed using five or more bands, the crossover frequency can be determined by scaling between around 4000 Hz and 600 Hz based on the number of FIR taps. In one embodiment, the crossover frequency can be determined according to the following equation:

$$F\text{crosssover}=-16.425\times\text{number of FIR filter taps}+4821.256 \quad (1)$$

For instance, the crossover frequency of a 100 taps FIR filter is about 3179 Hz. As another example, the crossover frequency of a 200 taps FIR filter is about 1536 Hz. In other embodiments, an FIR filter may start to lose its effectiveness at a frequency below 600 Hz or above 600 Hz.

In one embodiment, when the number of IIR bands is reduced below a threshold, the frequency region subject to FIR frequency correction can be expanded or stretched to fill in the gap. In one embodiment, the threshold can be five or less. In such case, the crossover frequency can be determined according to the following:

```
min_fir=50;
max_fir=256;
best_case=600;
worst_case=4000;
if lowest_corrected>200
    best_case=lowest_corrected+400;
end
low_IIR=1+1/(num_iir+.5);
if num_fir>max_fir
    num_fir=max_fir;
end
num_fir=num_fir−min_fir;
if num_fir<0
    num_fir=0;
end
max_fir=max_fir−min_fir;
if max_fir<1
    max_fir=1;
end
if num_iir>4
    F_crossover=(num_fir/max_fir)*best_case+
        (1−num_fir/max_fir)*worst_case;
else
    F_crossover=(num_fir/max_fir)*best_case+
        (1−num_fir/max_fir)*worst_case;
    F_crossover=x_freq/low_IIR;
end
if F_crossover<lowest_corrected*1.1
    F_crossover=lowest_corrected*1.1;
end
```

In one embodiment, the process 200 can convert the determined frequency correction curve into FIR filter coefficients. In block 226, the magnitude of the frequency correction curve is squared (e.g., in order to determine the power spectrum). In block 228, the process 200 performs conversion from frequency domain into time domain. This can be accomplished, for example, using Inverse Fast Fourier Transform (IFFT). In block 230, the process determines the FIR filter coefficients. In one embodiment, this can be accomplished by using Levinson-Durban recursion to derive an all-pole (or IIR) filter from the auto-correlation sequence. The all-pole filter can be inverted in order to obtain an FIR filter. In one embodiment, the steps performed in blocks 228 and 230 include traditional spectral modeling/estimation techniques.

In one embodiment, converting the frequency response curve to time domain representation in block 228 and deriving FIR filter coefficients in block 230 may not provide an optimal result. FIR filters may need to be converted to operate with various sampling rates. For instance, in case the CE device is a phone, it may be advantageous to listen to music at a higher sampling rate than to listen to a voice call. For example, music can be reproduced with high quality at about 48 kHz as compared to about 8 kHz for voice. In addition, as the sampling rate decreases, the number of FIR taps may also decrease and vice versa. It may be advantageous to further process the FIR coefficients derived in block 230 to get a more optimal frequency response and reduce filter length at lower sampling rates.

In one embodiment, the number of taps for scaled FIR filter can be determined according to the following equation:

$$N = \text{ceiling}\left(sf \times FirLength \times \frac{F_{s2}}{F_{s1}}\right) \quad (2)$$

where sf is a scale factor (for a safety margin), which can be selected between 1 and 1.2, FirLength is the length of the filter at sampling rate $F_{s1}$ and N is the filter length at a new sampling rate $F_{s2}$. In one embodiment, a secondary looping method can be used to determine the maximum required value for sf as it may vary slightly depending on the curve that is being fit.

Figure 3:
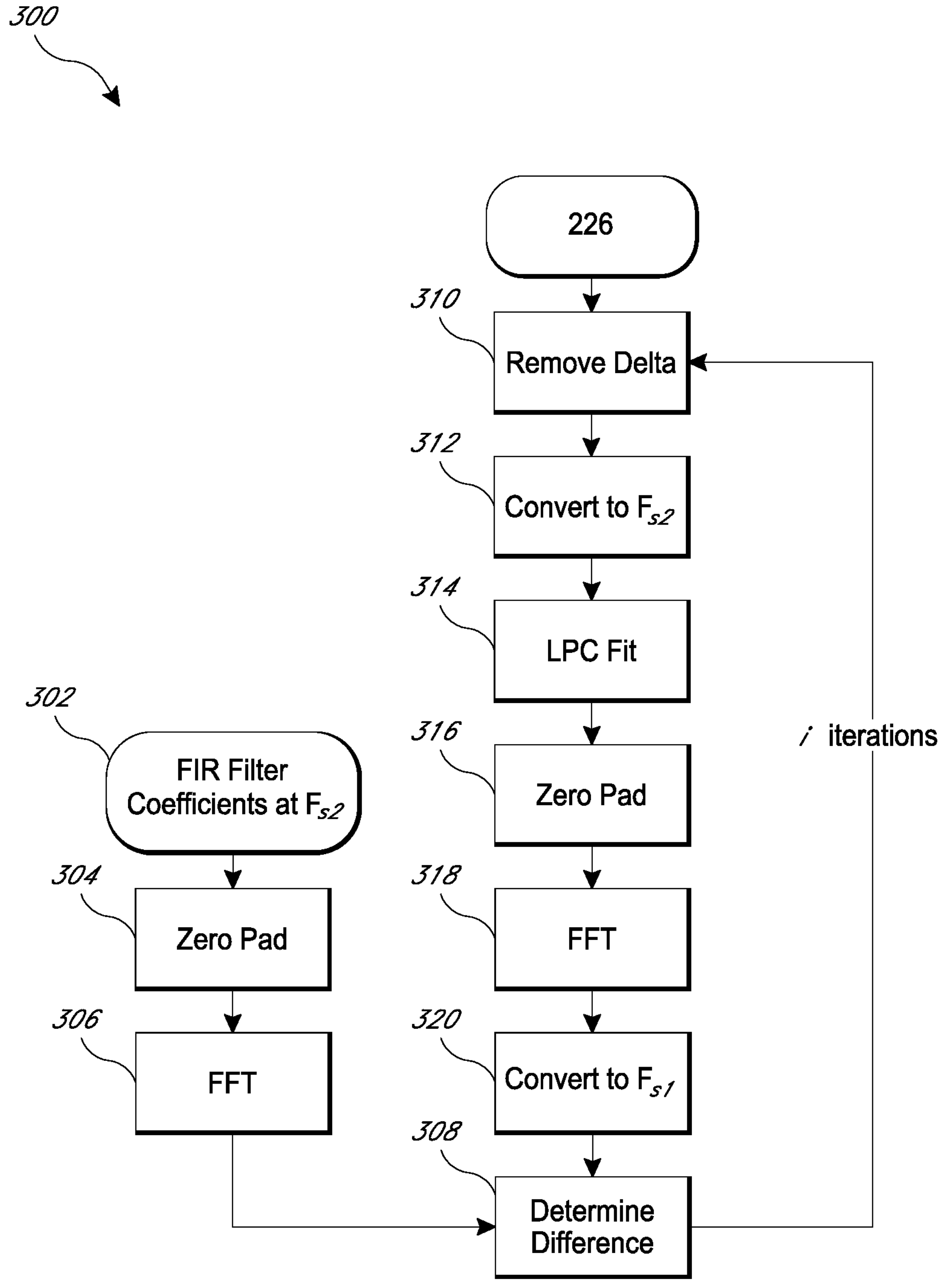
FIG. 3 illustrates an embodiment of a FIR filter scaling.

FIG. 3 illustrates an embodiment of a FIR filter scaling process 300. The process 300 can be executed by the correction determination module 112. The process 300 starts in block 302 where it obtains FIR filter coefficients at the sampling rate $F_{s1}$. For example, the process 300 can use the FIR filter coefficients determined in block 230 of FIG. 2. In block 304, the FIR filter coefficients are zero padded (if needed) before scaling the coefficients to new sampling rate $F_{s2}$. The process 300 transitions to block 306 where it converts the zero padded coefficients to frequency domain (e.g., by using FFT). In one embodiment, only the magnitude of the frequency domain spectrum is used. This frequency domain representation is used as an input to block 308 where the process 300 determines a difference with the scaled frequency domain representation at the new sampling rate $F_{s2}$ (which is determined according to the description below).

In block 310, the process 300 removes or attenuates the difference from the FIR filter frequency response determined in block 226 of FIG. 2. In one embodiment, the process 300 skips the processing in block 310 at the first iteration. In block 312, the process 300 scales the FIR filter frequency response to the new sampling rate $F_{s2}$. In block 314, the scaled FIR filter frequency response is subjected to LPC analysis (which can include performing the processing in blocks 226, 228, and 230 of FIG. 2). In block 316, the resulting FIR filter coefficients are zero padded. In block 318, the process 300 converts the zero padded FIR filter coefficients to frequency domain, and in block 320 the response is converted back to sampling rate $F_{s1}$ in order to determine, in block 308, the difference with the frequency domain representation of block 306. In one embodiment, the process 300 determines the difference between the frequency domain representation of FIR filter coefficients at the sampling rate $F_{s1}$ and the frequency domain representation of FIR filter coefficients at the new sampling rate $F_{s2}$. The process 300 can transition to block 310 to obtain a more optimal scaling. The process 300 can perform i iterations, such as 1, 2, 3, etc. In one embodiment, the process 300 can converge after about eight iterations. In one embodiment, when the process 300 scales the FIR filter coefficients to a higher sampling rate, such that $F_{s2}>F_{s1}$, frequency response values at higher frequencies, such as at frequencies exceeding $F_{s1}/2$, can be set to unity gain which can be determined as described above.

IIR Frequency Response Correction

Figure 4:
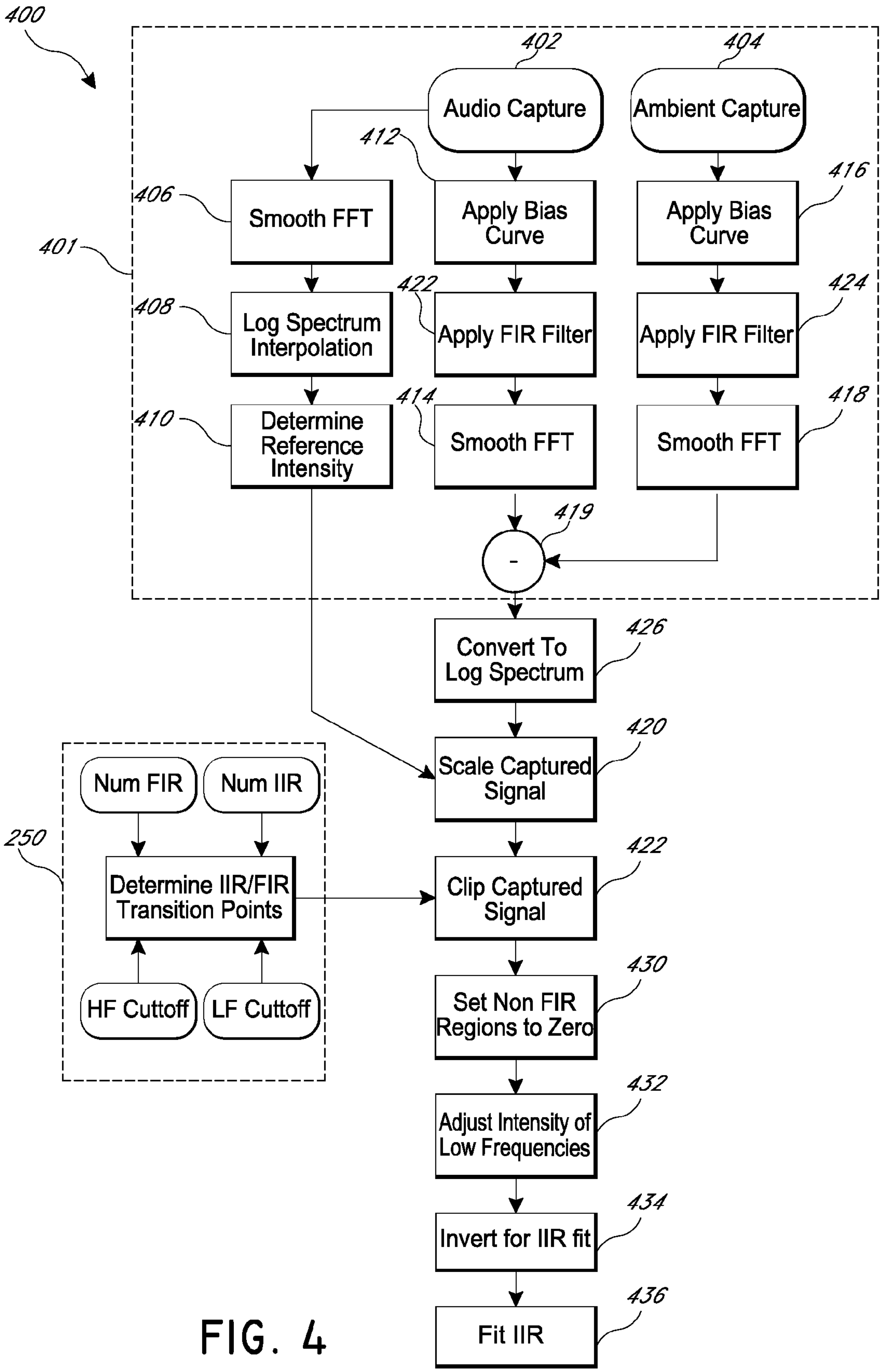
FIG. 4 illustrates an embodiment of frequency response correction process using infinite impulse response (IIR) filter(s)

FIG. 4 illustrates an embodiment of frequency response correction process 400 that uses IIR filter(s). The process 400 can be executed by the correction determination module 112. The process performs capture and analysis steps illustrated in block 401, which can be similar to the capture and analysis steps performed in block 201 by the process 200 of FIG. 2. One difference between the steps in block 401 and 201 is the application of FIR filter in blocks 422 and 424. The FIR filter applied to the captured audio signal (which may also be biased) can be the FIR filter determined in block 230 of FIG. 2.

In block 426, the process 400 converts the output of block 419 (or processed captured audio response) into logarithmic domain. For example, the magnitude of the processed captured audio signal is subjected to the conversion processing. In one embodiment, the conversion is performed according to the following processing:

```
for jj=1:n_bins
    F_center=(exp(log(F_min)+(log(F_max)-log(F_min))*(jj)/
        (n_bins-1)))*FFT_Size/F_s;
    F_center_floor=floor(F_center);
    F_center_ceil=ceil(F_center);
    F_center_delta= F_center- F_center_floor;
    x_sum=((1-F_center_delta)*x_smooth(F_center_floor)+
        (F_center_delta)*x_smooth(F_center_ceil))/2;
    x_sum=x_sum^2;
    H_in(jj)=-10*log10(x_sum);
end
```

where Fmin is the lowest frequency for IIR frequency response correction (e.g., FIR/IIR crossover frequency), Fmax is the maximum frequency for IIR frequency response correction, Fs is the sampling frequency of the captured audio signal, FFT_Size is the number of points in the frequency domain representation, and n_bins is the number of frequency bins or bands into which the frequency domain representation has been divided.

In block 420, the process 400 scales the captured audio response (converted into logarithmic domain) in a manner similar to the scaling performed in block 220 of FIG. 2. The process 400 can scale the captured audio response using a reference intensity, such as the zero dB point, determined in block 410. In block 422, the process 400 clips the scaled captured audio response in a manner similar to the clipping performed in block 222 of FIG. 2. In one embodiment, a user can specify minimum and/or maximum allowed gains, and the signal is adjusted so that it satisfies the gains.

In block 430, the process 400 can exclude from IIR correction one or more regions. In one embodiment, the excluded region(s) can be those frequency range(s) that are subject to FIR correction. For example, regions above the FIR/IIR crossover frequency may be subject to FIR correction and can be set to the reference intensity, such as the zero dB point. The processing in block 430 can be similar to the processing in block 224 of FIG. 2. In one embodiment, regions that are a certain percentage above the FIR/IIR crossover frequency can be excluded from IIR correction. For example, suitable percentage can be about 20% or higher. It may be advantageous to introduce such frequency correction overlap in case FIR frequency correction may not provide an optimal correction at lower frequencies. In one embodiment, frequency range below a lowest correction frequency can be set to the reference intensity, such as the zero dB point. For example, the lowest correction frequency can be selected as the cutoff frequency (or −3 dB frequency) of the speakers 140, such as about 100-200 Hz. In block 432, frequency range within Y percent of the lowest correction frequency can be set to the reference intensity, such as zero dB point. Y can be selected as any suitable value, such as about 10%. Performing the adjustment of block 432 can improve bass enhancement, prevent distortion, and the like.

In block 434, the process 400 performs conversion from frequency domain into time domain. This can be accomplished, for example, using Inverse Fast Fourier Transform (IFFT). In block 436, the process 400 determines IIR filter coefficients. In one embodiment, for a desired number of IIR filter bands, the process 400 adjusts the IIR filter parameters by a fixed amount in all possible directions and for all possible combinations. The process 400 then selects a filter producing the smallest mean squared difference from the target response. The process 400 can start with an assumption that all IIR bands can be adjusted at once, and, if at some point no bands can be adjusted, the process reduces the movement size for all parameters and repeats the processing. Also, if a maximum number of processing or fitting attempts has been performed, the process 400 continues with the assumption that only one band or filter can be adjusted at a time. In one embodiment, this reduces the risk of non-convergence.

Smoothing

In one embodiment, captured audio response (of blocks 202, 204, 402, and/or 404) may be jagged and/or otherwise distorted. It may be advantageous to apply perceptual, non-linear smoothing to the captured audio response whereby salient features of the response are retained and enhanced, while non-salient features are removed or attenuated. In one embodiment, smoothing can include three processing blocks. Captured audio response is converted from the time domain to frequency domain, such as by using the FFT. Averaging is performed on the converted captured audio response. In one embodiment, averaging can be performed in the logarithmic domain. Variable width averaging can also be performed to interpolate between the averaged captured audio response blocks, which can further smooth the captured audio response for FIR and/or IIR frequency response correction. In one embodiment, variable width averaging can be performed using neighboring points.

Figure 5:
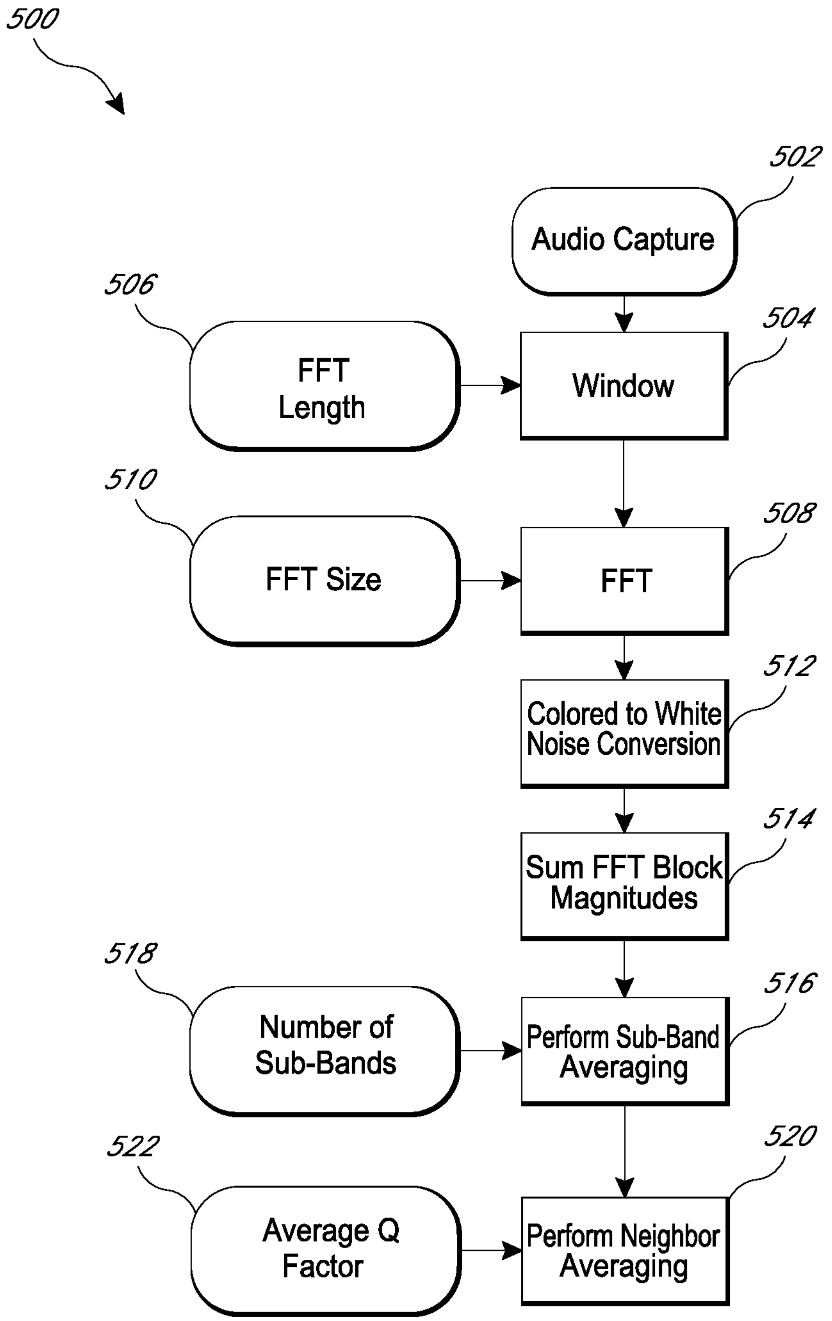
FIG. 5 illustrates an embodiment of smoothing process.

FIG. 5 illustrates an embodiment of a smoothing process 500. The process 500 can be executed by the correction determination module 112. The process 500 starts in block 504 with windowing the captured audio response of block 502. A suitable window is generated based on the length or size of the FFT, which is set in block 506. In one embodiment, Hanning window can be used. In other embodiments, any suitable window type can be used, such as Hamming, Tukey, Cosine, Lanczos, Triangular, and the like. In addition, overlapping (with any suitable overlap) or non-overlapping windows can be used. In one embodiment, the process 500 windows the captured audio response using a Hanning window with 50% overlap. In block 508, the process 500 converts the windowed captured audio response into frequency domain, for example, by using the FFT. The resolution of the FFT is selected in block 510. In one embodiment, a $2^{16}$ point FFT can be used. As a result of the processing performed in steps 504 and 508, the process 500 obtains a frequency domain representation of the captured audio signal.

In block 512, the process 500 performs a frequency spectrum conversion from a colored noise, such as pink noise, test audio sequence to a white noise test audio sequence. In one embodiment, the frequency spectrum of the captured audio signal is adjusted so that the frequency response is flat or substantially flat, and thereby resembles the frequency spectrum of white noise. In block 514, the process 500 determines total magnitude for each of the bands of frequency domain converted captured audio signal. In one embodiment, the process 500 performs in block 514 overlap and add averaging of the frequency response of captured audio signal. In one embodiment, a duration L of audio signal can be captured and digitized. For example, L can be 11 seconds, less than 11 seconds, or more than 11 seconds. The digitized captured audio signal can be divided into blocks or chunks of N samples. For example, N can be 65,000, less than 65,000, or more than 65,000 samples. In block 504, a window can be applied to each N-sample chunk, and each windowed N-sample chunk can be converted to frequency domain in block 508. The window can be tapered at the edges. Because windowing can remove or attenuate the data at the edges of each N-sample chunk, an overlap and add method can be performed in block 514 to ensure that all captured data is used. Frequency spectrum of each chunk can be averaged to obtain a mean value for the chunk. The mean value can be subtracted in order to obtain a reduction in noise (e.g., obtain a reduction in noise in the magnitude spectrum).

In block 516, the process 500 performs smoothing of the frequency spectrum of the captured audio signal. In one embodiment, magnitudes of the frequency spectrum are grouped into bands or sets of one or more magnitude values. The process 500 determines a plurality of mean values corresponding to the plurality of bands of magnitudes, and sets the magnitude values of the band to the corresponding mean value. The number of bands in the plurality of bands is selected in block 518. In one embodiment, magnitude values are associated with the bands in the logarithmic domain. That is, frequency points (or FFT bins) are grouped into bands using logarithmic spacing along the frequency axis. In another embodiment, magnitude values are grouped into bands using linear spacing. In yet another embodiment, a combination of logarithmic and linear spacing can be used.

In one embodiment, center frequencies corresponding to the bands are determined using the following equation:

$$F_{center,jj} = \text{floor}\left[0.5\times\text{FFF\_Size}\times\left(\frac{0.5\times F_s}{bottomBand}\right)^{-\frac{NumBands-jj}{NumBands-1}}\right] \quad (3)$$

where $F_s$ is the sampling frequency (e.g., 48 kHz), FFT_Size is selected in block 510, bottomBand corresponds to the lowest correction frequency, NumBands corresponds to the desired number of bands and is selected in block 518, and jj indicates the current band (e.g., from 1 to NumBands). In one embodiment, value of NumBands can be selected from the range between 1 and 500. In another embodiment, value of NumBands can be selected from a different range, such as between 1 and less than 500, 1 and greater than 500, greater than 1 and less than 500, greater than 1 and greater than 500, etc. In one embodiment, if logarithmic spacing is utilized, computed center frequencies are logarithmically spaced, with center frequencies in the lower frequency range being spaced closer together than center frequencies in the higher frequency range.

In block 516, the process 500 can compute a plurality of average magnitude values corresponding to each band in the plurality of bands. The magnitude of each point in a particular set can be set to the computed average value associated with the set. The averaged values can form a new magnitude for each band in the frequency spectrum. In one embodiment, due to index rounding, lower frequency magnitude values are overwritten (or set to the average value) more than once, which can result in a new frequency spectrum having slightly less bands than the specified number of bands (e.g., NumBands). In one embodiment, specifying a smaller number of bands can provide a smoother output. In one embodiment, specifying a larger number of bands can provide a coarser output. In one embodiment, 100 bands can be used.

In block 520, the process 500 can perform neighbor averaging for further smoothing. In one embodiment, each magnitude point or value in the frequency spectrum determined in block 516 can be averaged with one or more of its neighbors, such as nearest neighbors, and the magnitude vale can be set to the computed average value. In one embodiment, the process 500 can average the following neighboring magnitude values:

$$jj-\text{numberNeighbors}, jj-\text{numberNeighbors}+1, \ldots, jj+\text{numberNeighbors} \quad (4)$$

where numberNeighbors corresponds to the number of nearest neighbors and can be determined according to:

$$numberNeighbors = \text{floor}\left(\frac{jj}{AVQF} - 1\right) \quad (5)$$

where AVQF is selected in block 522. In one embodiment, AVQF value can be selected from the range between 1 and 100. In another embodiment, AVQF can be selected from a range between 1 and 100 or less, between 1 and 100 or more, etc. In one embodiment, the maximum number of nearest neighbors numberNeighbors can be constrained by $$500\times\frac{\text{FFT\_Size}}{F_s}$$

if the number of bands is more than 20 and by $$1000\times\frac{\text{FFT\_Size}}{F_s}$$

it the number of bands in less than 20. Such constraining can help prevent over-smoothing and can allow for having one or more plateaus in the frequency response. In one embodiment, the minimum number of nearest neighbors can be set to 1 so that all points are averaged.

Figure 6:
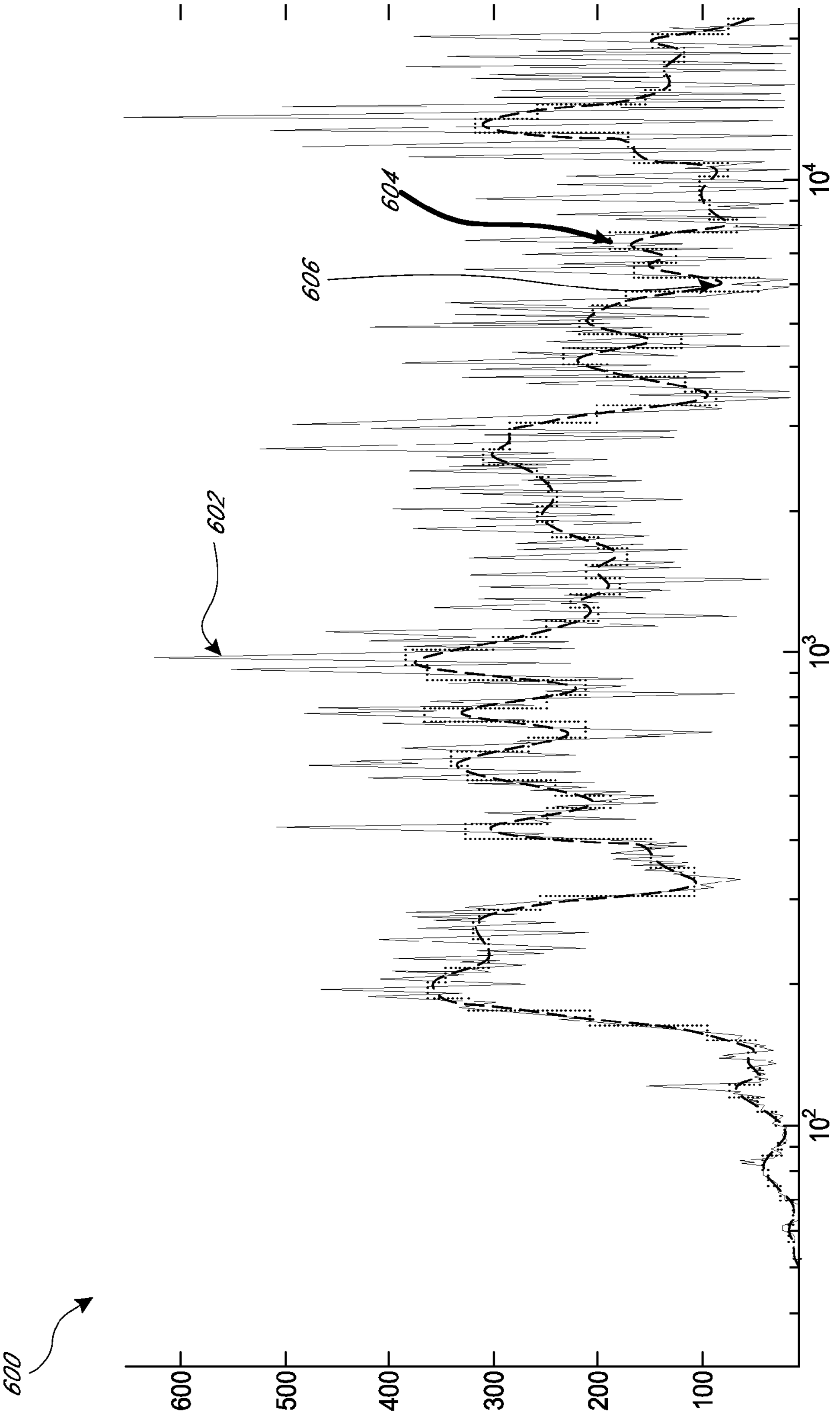
FIG. 6 illustrates example plot of smoothed audio capture.

FIG. 6 illustrates an example plot 600 of smoothed audio capture. The x-axis represents frequency using logarithmic spacing and the y-axis represents the intensity. Curve 602 corresponds to the output of block 514 of FIG. 5. As is illustrated, curve 602 is jagged and distorted. Curve 604 corresponds to the output of block 516 of FIG. 5. As is illustrated, curve 604 provides a much smoother response that curve 602. However, the transitions in curve 604 are somewhat blocky. Curve 606 corresponds to the output of block 520 of FIG. 5. As is illustrated, the response in curve 606 is smooth, non-jagged, and non-distorted. In addition, blocky transitions have been removed or attenuated.

Notch Removal

In some embodiments, narrow band positive gain may be more easily detected by listeners than narrow band gain reduction. As such, if there is one or more narrow band notches (or gain reductions) in the frequency response, it may be more advantageous not to correct them at all than possibly introducing distortion(s) when correcting them. Also, it may be advantageous to remove or attenuate one or more narrow band peaks that are undesirable, as doing so is unlikely to degrade the subjective playback quality.

Figure 7A:
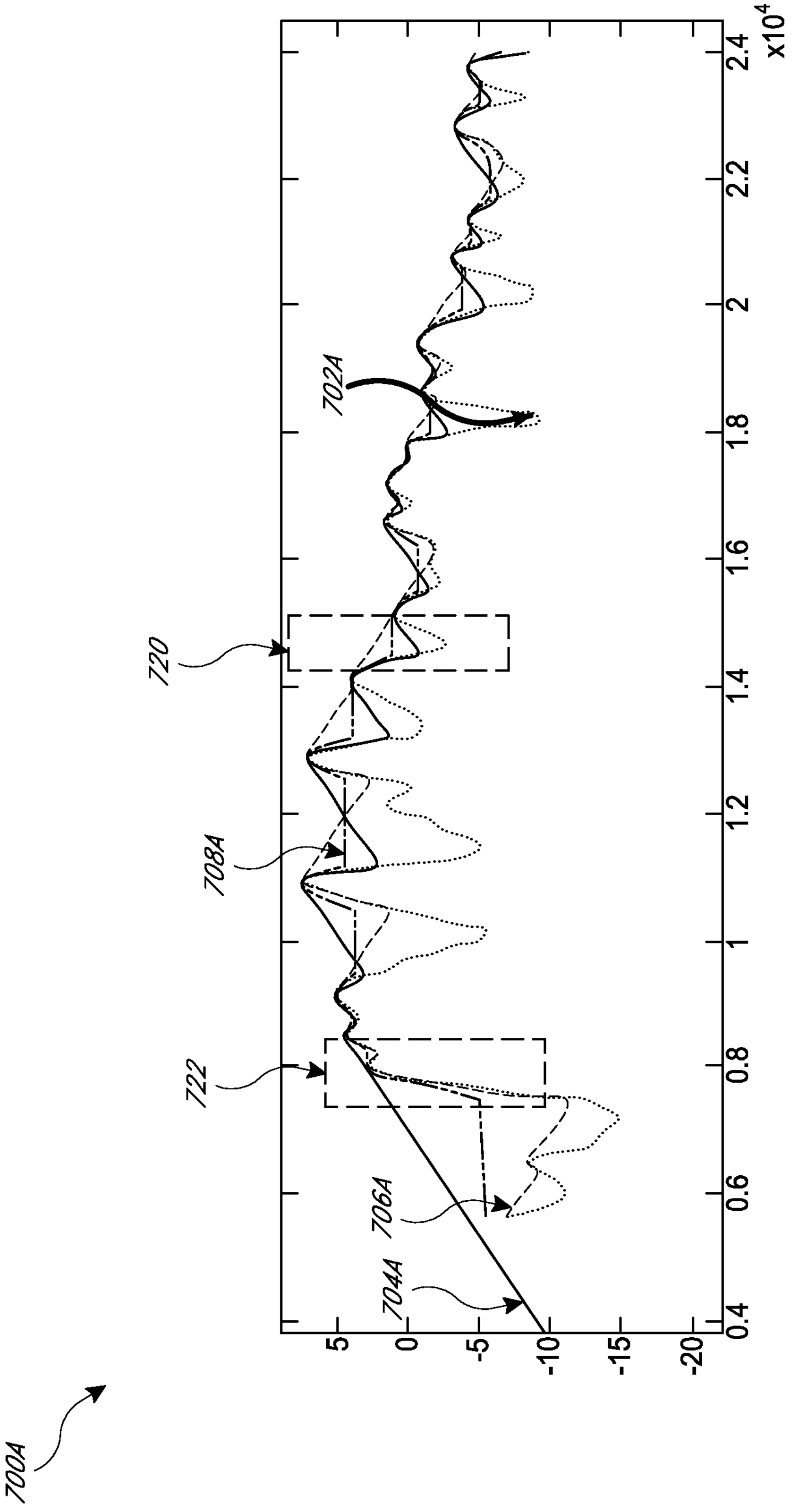
FIGS. 7A-7B illustrate example plots of notch removal.

In one embodiment, notch removal is performed after smoothing. Notch removal can identify areas that may degrade subjective playback quality and recommend removal of such areas. Notch removal can convert smoothed audio response (or frequency representation of smoothed audio response) into logarithmic domain, and iteratively apply a forward and reverse sample and hold process with certain decay rate to the obtained logarithmic representation of the response. Conversion into logarithmic domain can include converting the magnitudes to logarithmic representation. The decay rate can be configured such that the sample and hold process is performed until there remain less than a point under the frequency response. Effectively, the sample and hold process drapes a tent over local maxima in the logarithmic representation of the response. FIG. 7A illustrates an example plot 700A of notch removal. The x-axis represents frequency on logarithmic scale and the y-axis represents the intensity.

Curve 702A illustrates smoothed audio response, such as response output by block 520 of FIG. 5 and converted to logarithmic representation. Curve 704A illustrates the output of reverse sample and hold process applied to curve 702A. Curve 706A illustrates the output of forward sample and hold process applied to curve 702A. Curves 704A and 706A can be averaged to determine a fully patched version of the audio response, as is illustrated by curve 708A.

In one embodiment, the averaging may undesirably remove or attenuate one or more salient features from the audio response, and notch recognition and correction can be used to mitigate this problem. With reference to FIG. 7A, by averaging the reverse and forward sample and hold curves 704A and 706A, a flat top appears in curve 708A above at least some two-sided notches, as is illustrated in region 720. Sharp drops or rises in the frequency response are maintained, as is illustrated in region 722. In one embodiment, notch recognition and correction can detect and select for correction one or more regions where there is a gap between the flat top in curve 708A and the smoothed audio response curve 702A. In one embodiment, a subset or all regions having worst case deviations are selected for correction. The edges of such regions can be cross faded with the smoothed audio response (e.g., curve 702A) in order to smooth the transitions.

Figure 7B:
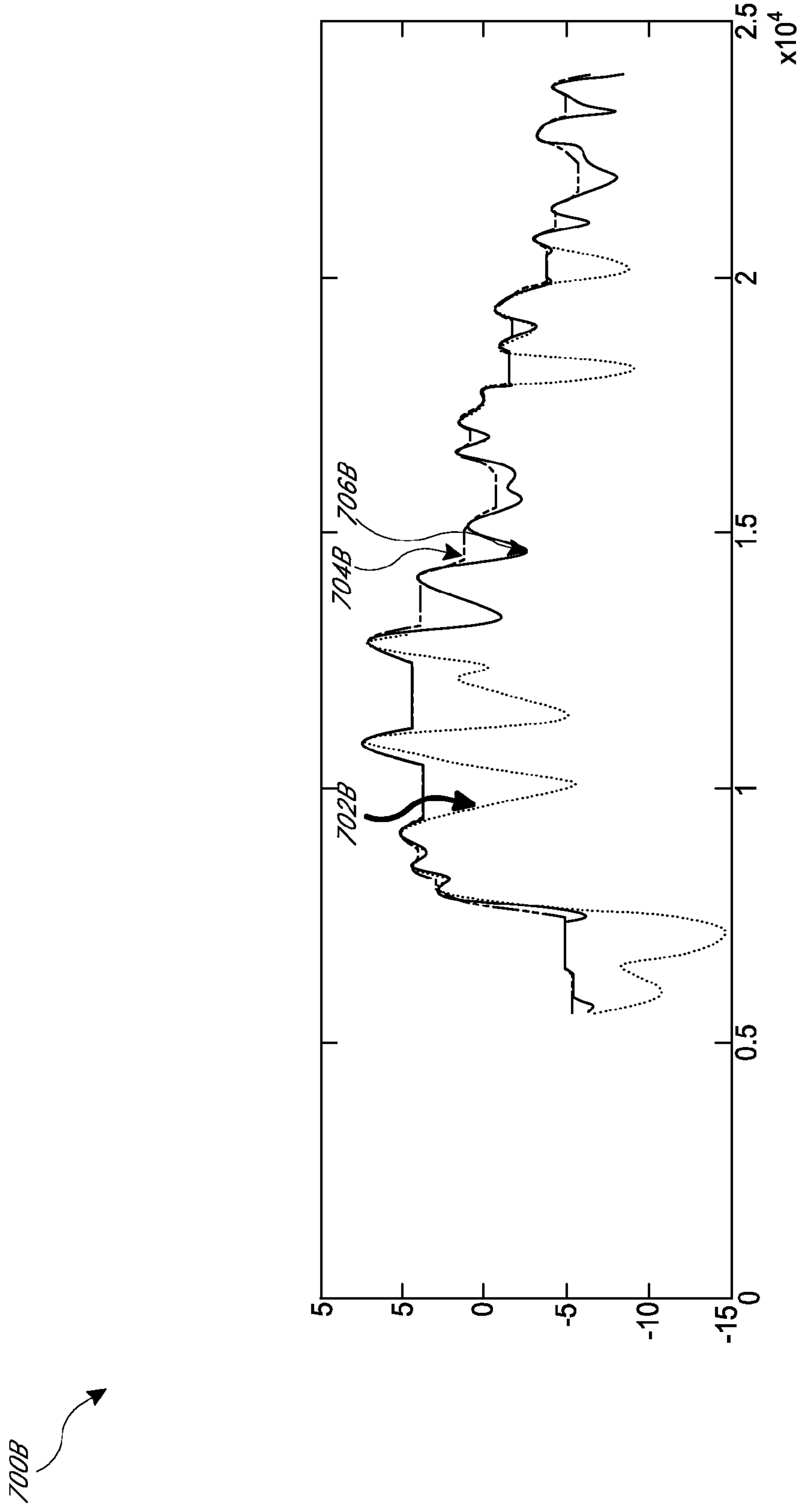

FIG. 7B illustrates an example plot 700B of notch removal and recognition. The x-axis represents frequency on logarithmic scale and the y-axis represents the intensity. Curve 702B illustrates smoothed audio response, which is the same as is illustrated by curve 702A of FIG. 7A. Curve 704B illustrates average of reverse and forward sample and hold process curve, which is the same as is illustrated by curve 708A of FIG. 7A. Curve 706B illustrates a final fully patched version of the audio response with notch recognition and correction applied. In one embodiment, a flat top connecting one or more peak can also be created. For example, neighboring peaks can be connected by a line if such method of patching is desired (e.g., by a user).

Figure 8:
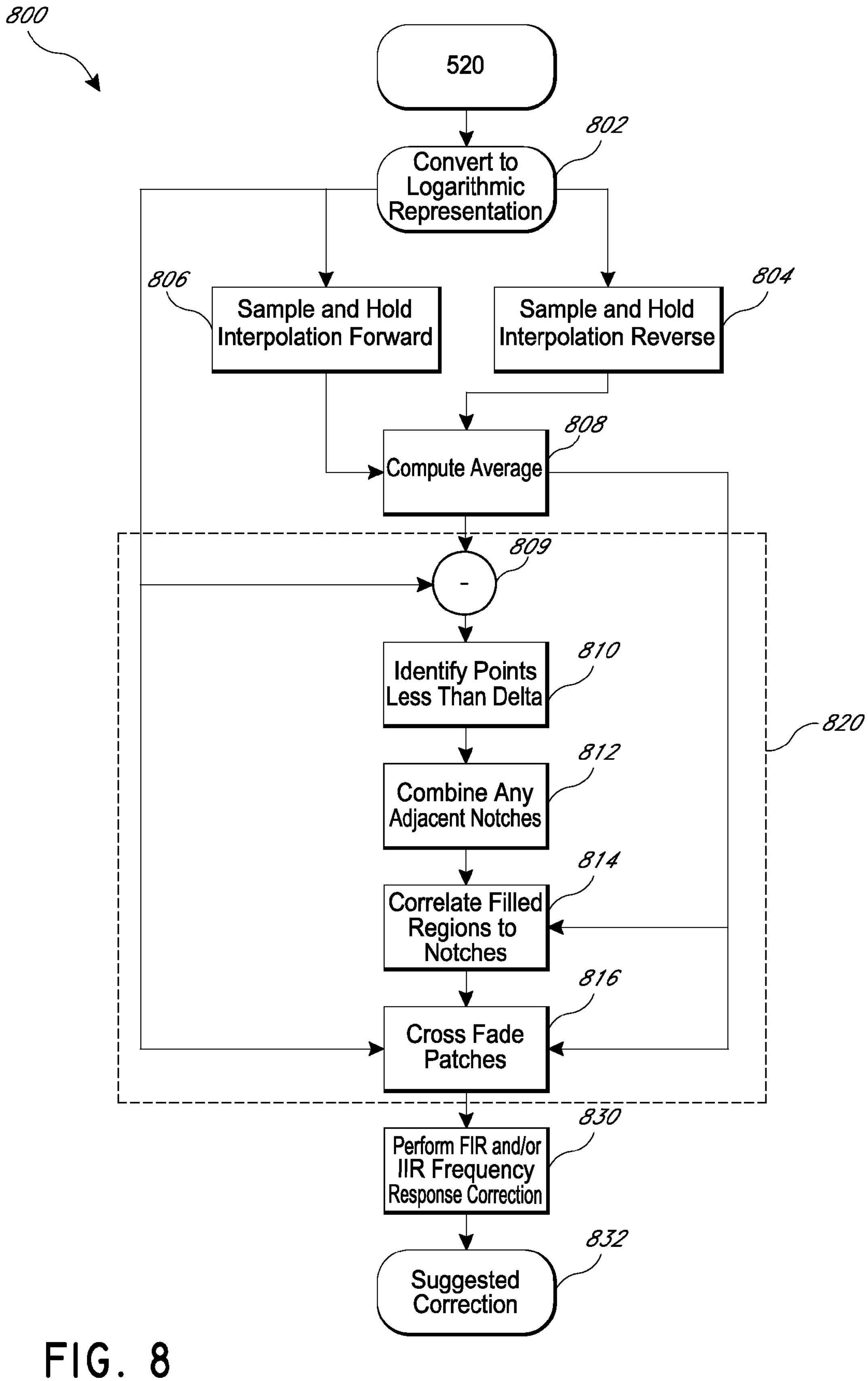
FIG. 8 illustrates an embodiment of notch removal process.

FIG. 8 illustrates an embodiment of notch removal process 800. The process 800 can be executed by the correction determination module 112. In block 802, the process 800 converts smoothed audio response output by block 520 of FIG. 5 into logarithmic representation. In blocks 804 and 806, the process 500 performs reverse and forward sample and hold interpolation respectively on the logarithmic representation of smoothed audio response. In block 808, the process averages the reverse and forward sample and hold interpolations of blocks 804 and 806.

The process 800 performs notch recognition and correction in block 820. In block 809, the process 800 subtracts the determined average from the logarithmic representation of smoothed audio response to determine a difference. In block 810, the process 800 identifies one or more points or values that are below the difference determined in block 809. For example, all points that are X dB below the difference can be identified. In one embodiment, X is selected from a range between 3 and 6 dB. In another embodiment, X is selected from a range between 3 dB or less or more and 6 dB or less or more. In block 812, the process 800 can combine one or more adjacent notches in order to, for example, increase efficiency. For example, adjacent notches may be combined so that the same notch is not corrected again due to being identified as part of multiple notches. In block 814, the process 800 can correlate one or more regions where notch(es) have been removed or attenuated with the removed or attenuated notch(es). In block 816, the process 800 can cross fade the one or more regions with the logarithmic representation of smoothed audio response.

In block 830, the process 800 performs FIR and/or IIR frequency response corrections as described above. In block 832, the suggested corrected response is provided to the user. The user can override and/or modify the suggested corrected response. For example, the user can override and/or modify any undesirable corrections.

User Interface for Frequency Response Correction

Figure 9:
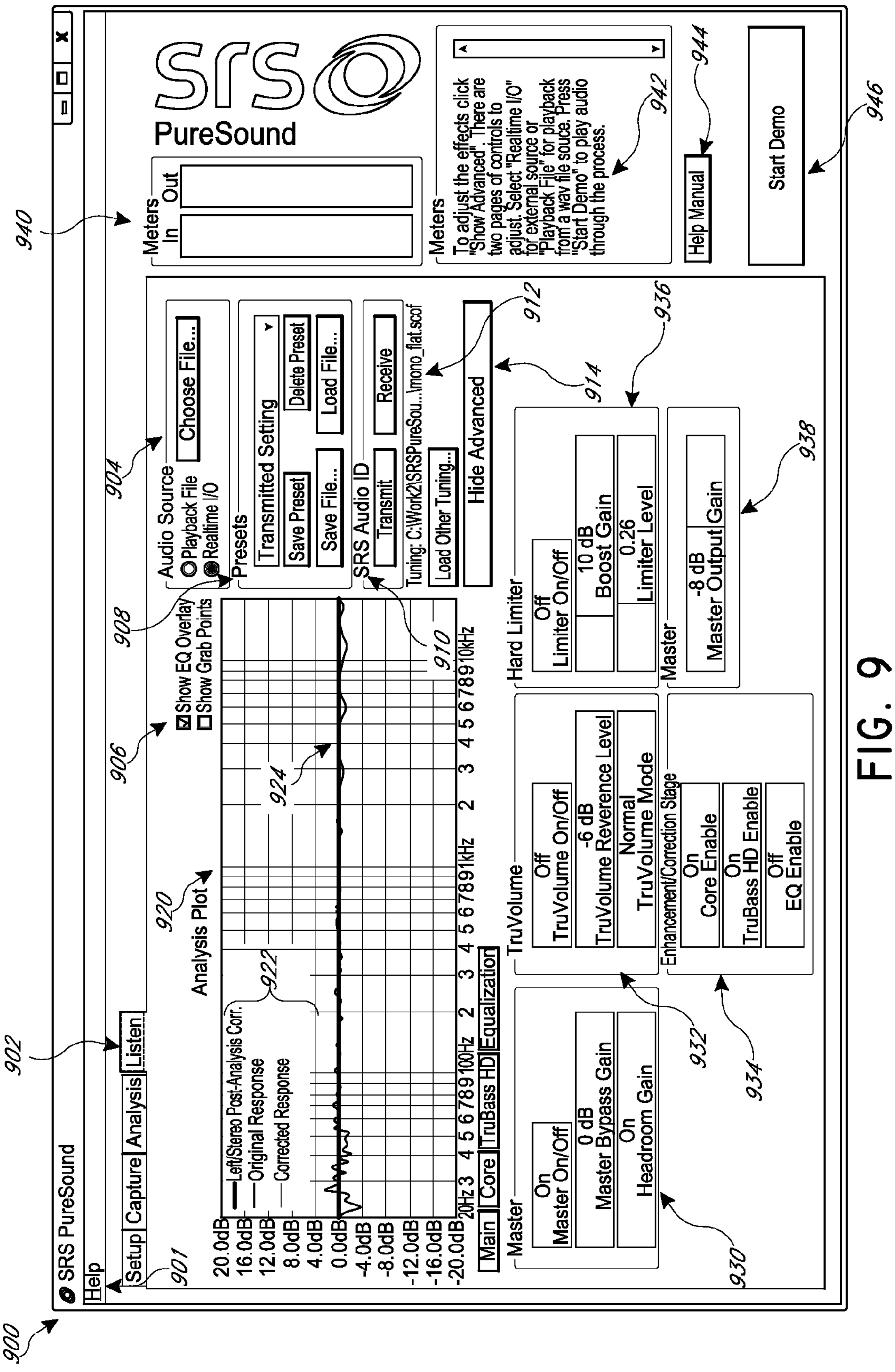
FIGS. 9-13 illustrate example user interfaces for performing frequency response correction.

FIG. 9 illustrates an example user interface 900 for performing frequency response correction. The user interface 900 can be generated by the correction determination module 112. The user interface 900 can be output as a graphical user interface in a standalone application or in a browser as a web page. Further, the user interface 900 can be output on a display of the frequency response correction system 110. As described above, any of the user interfaces described herein can be output directly by the CE device 130. For example, the user interface 900 and other user interfaces described herein can be output on a television or other CE device 130 and controlled directly by one or more processors of the television or other CE device 130 together with user input from a peripheral such as a remote control, mouse, keyboard, or the like.

The example user interface 900 shown includes a menu 901 configured to provide user help and menu tabs 902 configured to provide frequency response correction options, such as system setup, audio capture, analysis, and listening to corrected audio response. As is illustrated, listening tab has been selected. The user interface 900 includes a control 904 that provides audio source options. For example, the user can select via radio buttons whether to listen to playback of a file or playback of realtime audio input. The user can select file for playback via a button and file menu. The user interface 900 includes checkboxes 906 for selecting the content of a graphical display 920. The user interface 900 includes a control 908 for managing frequency response corrections. The control 908 includes buttons, selection boxes, and file menus for loading, saving, and deleting frequency response corrections. The user interface 900 includes a control 910 for providing data to a CE device and receiving data from the CE device. Data can include frequency response correction parameters. The control 910 includes buttons for transmitting and receiving data. The user interface 910 includes a control 912 for loading test audio sequences (for playback). The control 912 includes a button for selecting a test audio sequence and an information box, such as a text box or label, for displaying the location and/or name of the selected test audio sequence. The user interface 900 includes a button 914 for displaying or hiding advanced settings, which are described below. The user interface 900 includes controls, such as buttons, 918 for enabling and/or disabling additional settings, such as low frequency enhancement (TruBass HD), surround sound enhancement (Core), equalization, and the like.

The user interface 900 includes the graphical display 920 configured to illustrate the operation of the frequency response correction. The graphical display 920 includes a legend 922 and one or more plots 924. For example, original and/or correction frequency response can be plotted. The graphical display 920 also includes axis and a grid. As is illustrated, x-axis represents frequency (in Hz) and y-axis represents magnitude (in dB). The user interface 900 includes controls 930, 932, 934, 936, and 938 configured to provide input, correction, enhancement, and the like. Controls 930, 932, 934, 936, and 938 include buttons, scroll bars, sliders, and the like. The user interface 900 includes controls 940 for graphically displaying the intensity of audio input and/or output. Controls 940 can include scroll bars, sliders, and the like. The user interface 900 includes a text box 942 for displaying help information, a button 944 for displaying user help manual, and a button 946 for starting a demonstration of the frequency response correction. In addition to those parameters shown in the user interface 900, additional parameters can be displayed and adjusted. Other user interface elements can be used in addition to or instead of the illustrated elements.

Figure 10:
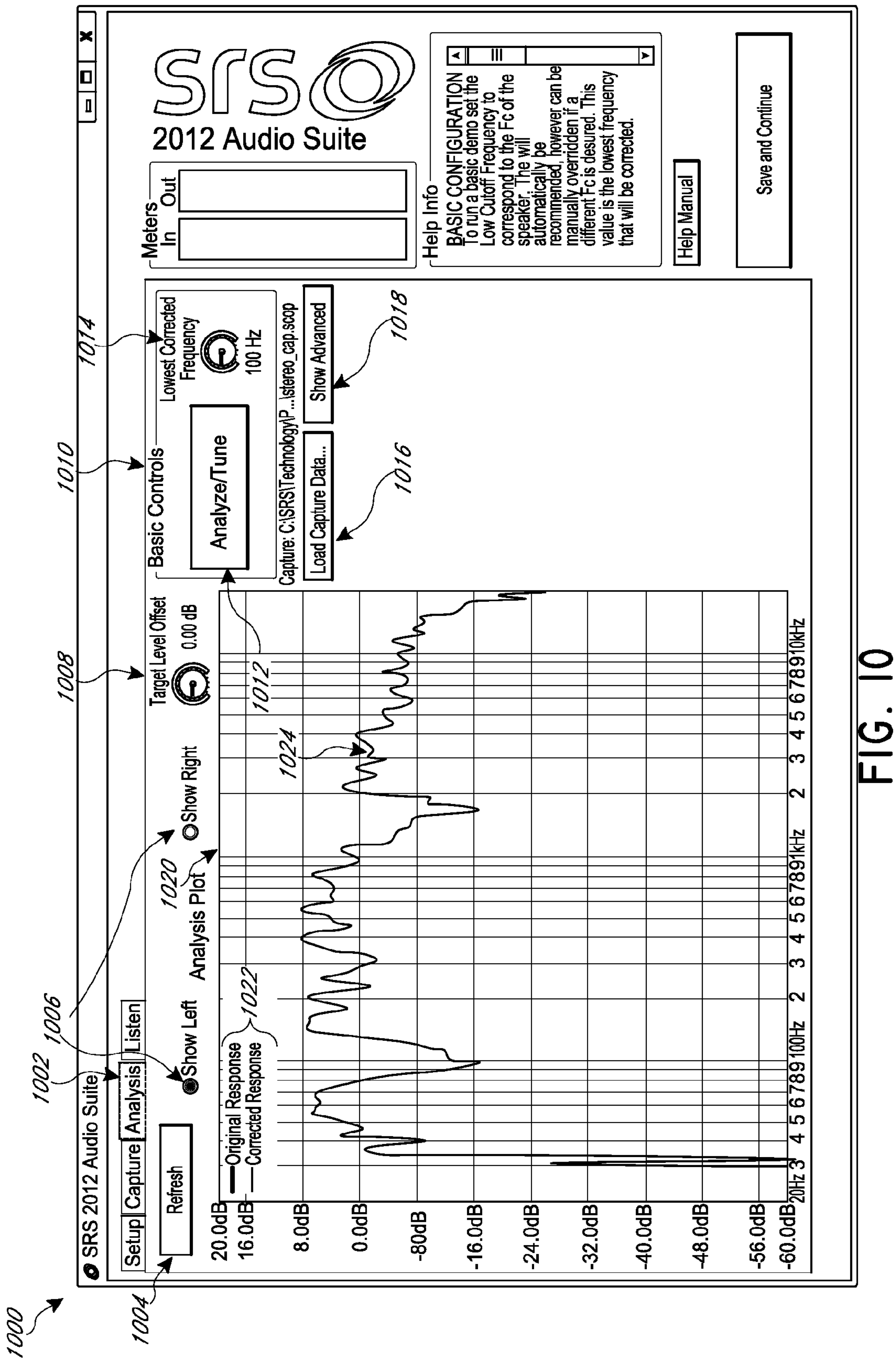

FIG. 10 illustrates an example user interface 1000 for performing frequency response correction. The user interface 1000 can be generated by the correction determination module 112. The user interface 1000 can be output as a graphical user interface in a standalone application or in a browser as a web page. Further, the user interface 1000 can be output on a display of the frequency response correction system 110.

The user interface 1000 includes menu tabs 1002 configured to provide frequency response correction options, such as system setup, audio capture, analysis, and listening to corrected audio response. As is illustrated, analysis tab has been selected. The user interface 1000 includes a button 1004 for refreshing the graphical display 1020, which is configured to illustrate the operation of the frequency response correction. The graphical display 1020 includes a legend 1022 and one or more plots 1024. For example, original and/or correction frequency response can be plotted. The graphical display 1020 also includes axis and a grid. As is illustrated, x-axis represents frequency (in Hz) and y-axis represents magnitude (in dB).

The user interface 1000 includes controls 1006, such as radio buttons, for displaying in the graphical display 1020 frequency response of one or more speakers, such as left and right speakers. The user interface 100 includes control 1008 for selecting the reference intensity (such as the zero dB point). The user interface 1000 includes controls 1010 for modifying one or more analysis parameters. For example, analysis can be started using a button 1012 and lowest corrected frequency can be modified using control 1014, such as a dial. In one embodiment, controls 1010 expose basic analysis parameters. The user interface 1000 includes controls 1016 for loading captured audio response, such as a button and label, and control 1018 for showing and/or hiding advanced settings. In addition to those parameters shown in the user interface 1000, additional parameters can be displayed and adjusted. Other user interface elements can be used in addition to or instead of the illustrated elements.

Figure 11:
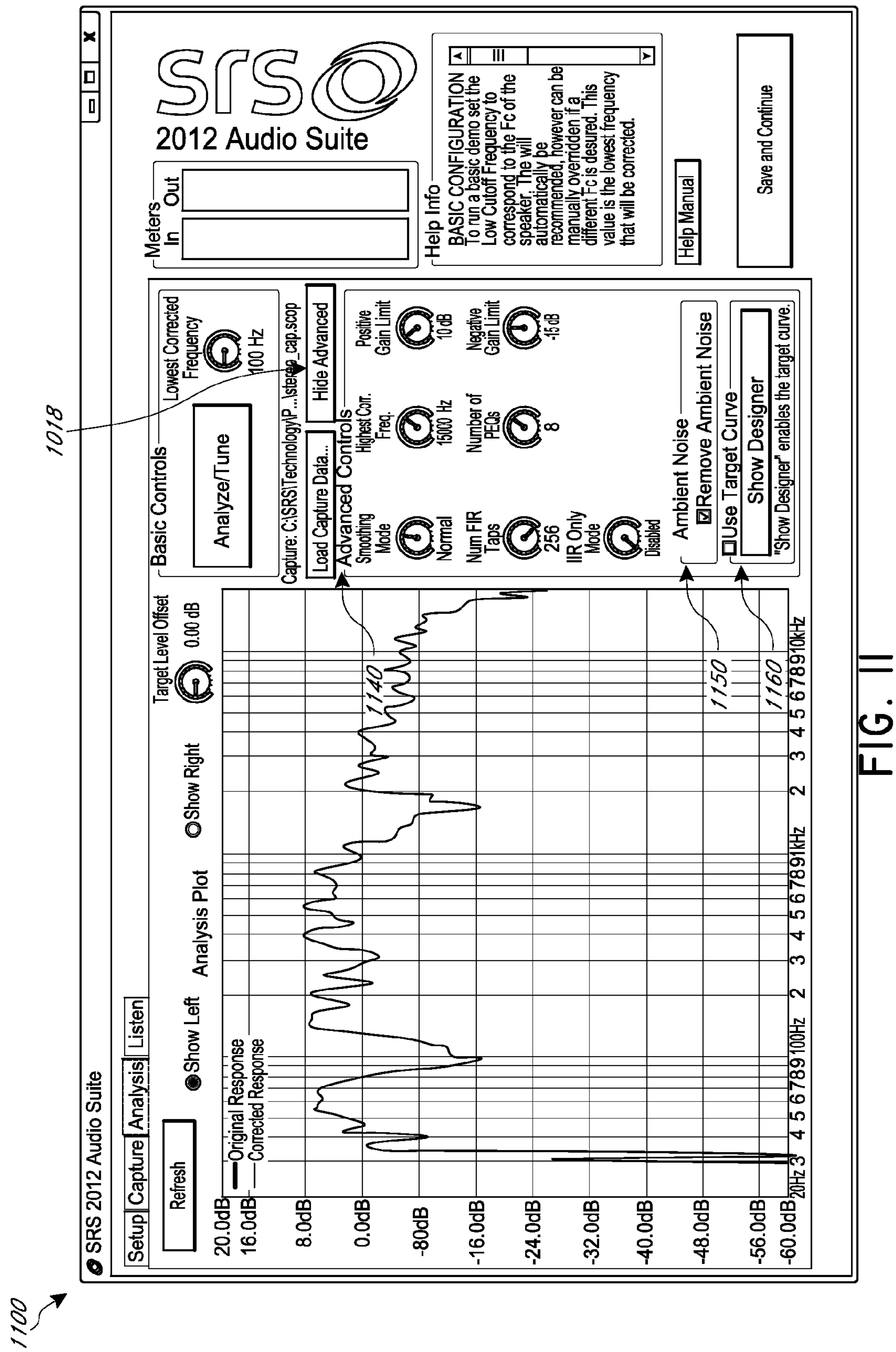

FIG. 11 illustrates an example user interface 1100 for performing frequency response correction. The user interface 1100 can be generated by the correction determination module 112. The user interface 1100 can be output as a graphical user interface in a standalone application or in a browser as a web page. Further, the user interface 1100 can be output on a display of the frequency response correction system 110.

The user interface 1100 is similar to the user interface 1000 of FIG. 10 with the exception that advanced settings controls 1140 are shown. Advanced setting controls 1140 can be displayed by clicking the button 1018. Advanced settings controls 1140 include controls, such as dials, for adjusting the smoothing, selecting highest corrected frequency, selecting the maximum gain, selecting the minimum gain, selecting the number of FIR filter taps, selecting the number of IIR filter bands (or PEQs), and selecting between FIR and/or IIR modes. In one embodiment, the control for adjusting the smoothing is configured to adjust the smoothing mode, such as, "normal" for recommended smoothing, "heavy" for a gradual correction that may have larger deviations from a target (or captured) response, "none" for no smoothing, and the like. Advanced settings controls 1140 also include control 1150, such as a checkbox, for removal of distortions due to ambient surroundings and control 1160 for displaying a user interface for designing a biasing curve. In addition to those parameters shown in the user interface 1100, additional parameters can be displayed and adjusted. Other user interface elements can be used in addition to or instead of the illustrated elements.

Figure 12:
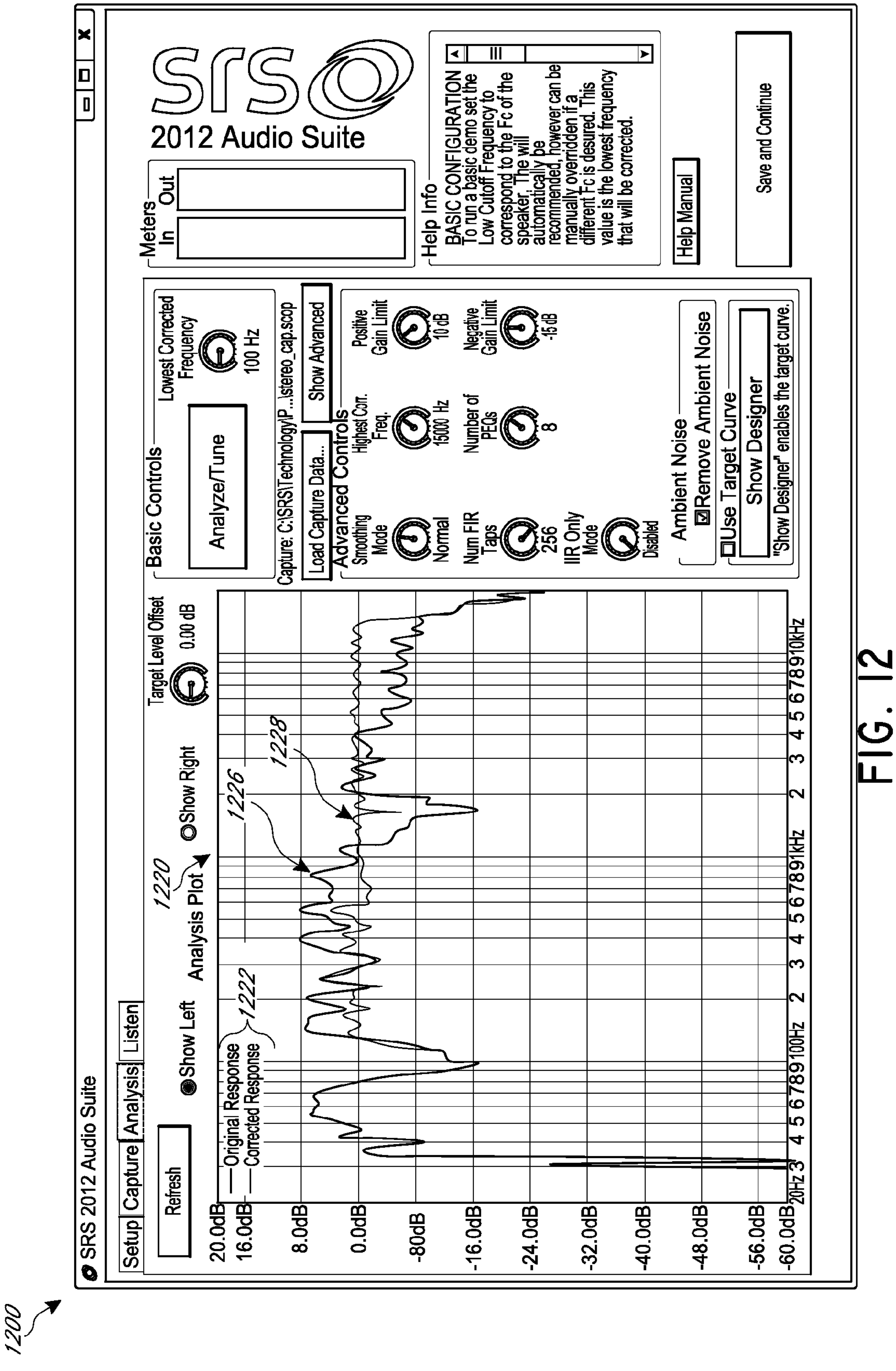

FIG. 12 illustrates an example user interface 1200 for performing frequency response correction. The user interface 1200 can be generated by the correction determination module 112. The user interface 1200 can be output as a graphical user interface in a standalone application or in a browser as a web page. Further, the user interface 1200 can be output on a display of the frequency response correction system 110.

The user interface 1200 is similar to the user interface 1100 of FIG. 11. However, both the captured audio response curve 1226 and the corrected audio response curve 1228 are displayed in the graphical display 1220. The legend 1222 reflects that both curves are displayed. In addition to those parameters shown in the user interface 1200, additional parameters can be displayed and adjusted. Other user interface elements can be used in addition to or instead of the illustrated elements.

Figure 13:
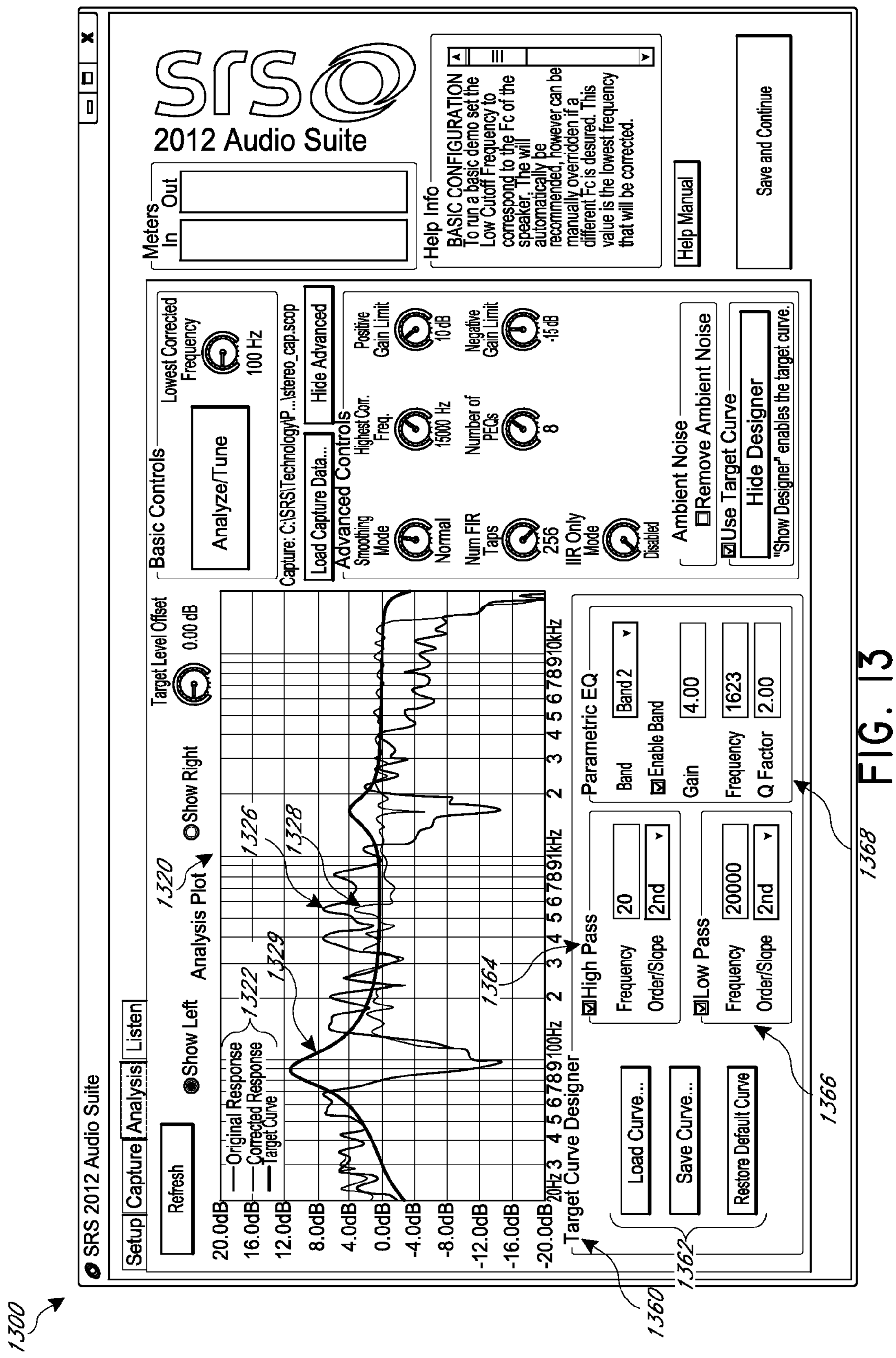

FIG. 13 illustrates an example user interface 1300 for performing frequency response correction. The user interface 1300 can be generated by the correction determination module 112. The user interface 1300 can be output as a graphical user interface in a standalone application or in a browser as a web page. Further, the user interface 1300 can be output on a display of the frequency response correction system 110.

The user interface 1300 is similar to the user interface 1100 of FIG. 11 except that a user interface 1360 for designing the biasing curve are displayed. The graphical display 1320 shows the captured audio response curve 1326, the corrected audio response curve 1328, and the biasing curve 1329. The legend 1322 reflects that these three curves are displayed. The user interface 1360 includes controls 1362 for loading, saving, and restoring biasing curves and controls 1364, 1366, and 1368 for designing biasing curves. Controls 1364 and 1366 are configured to select, respectively, high pass and low pass filters parameters. Controls 1368 are configured to specify and select parameters of IIR filter bands. The parameters include frequency range, gain, center frequency, quality factor, and the like. In addition to those parameters shown in the user interface 1300, additional parameters can be displayed and adjusted. Other user interface elements can be used in addition to or instead of the illustrated elements.

Additional Embodiments

In some embodiments, in addition to or instead of digital FIR and/or IIR filter correction, other techniques can be used. For example, analog filter correction can be utilized. Although described in the context of correcting the frequency response of a television, disclosed systems and methods can be utilized with any CE device that includes a sound source, such as a speaker, headphone, etc.

CONCLUSION

Many other variations than those described herein will be apparent from this disclosure. For example, depending on the embodiment, certain acts, events, or functions of any of the algorithms described herein can be performed in a different sequence, can be added, merged, or left out all together (e.g., not all described acts or events are necessary for the practice of the algorithms). Moreover, in certain embodiments, acts or events can be performed concurrently, e.g., through multi-threaded processing, interrupt processing, or multiple processors or processor cores or on other parallel architectures, rather than sequentially. In addition, different tasks or processes can be performed by different machines and/or computing systems that can function together.

The various illustrative logical blocks, modules, and algorithm steps described in connection with the embodiments disclosed herein may be implemented as electronic hardware, computer software, or combinations of both. To clearly illustrate this interchangeability of hardware and software, various illustrative components, blocks, modules, and steps have been described above generally in terms of their functionality. Whether such functionality is implemented as hardware or software depends upon the particular application and design constraints imposed on the overall system. The described functionality may be implemented in varying ways for each particular application, but such implementation decisions should not be interpreted as causing a departure from the scope of the disclosure.

The various illustrative logical blocks and modules described in connection with the embodiments disclosed herein may be implemented or performed by a machine, such as a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be a processor, controller, microcontroller, or state machine, combinations of the same, or the like. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium can be coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While the above detailed description has shown, described, and pointed out novel features as applied to various embodiments, it will be understood that various omissions, substitutions, and changes in the form and details of the devices or algorithms illustrated may be made without departing from the spirit of the disclosure. As will be recognized, certain embodiments of the inventions described herein may be embodied within a form that does not provide all of the features and benefits set forth herein, as some features may be used or practiced separately from others. The scope of certain inventions disclosed herein is indicated by the appended claims rather than by the foregoing description. All changes which come within the meaning and range of equivalency of the claims are to be embraced within their scope.

What is claimed is:

1. A method of correcting frequency response of an electronic device, the method comprising:

capturing an audio signal output by an electronic device, the capturing comprising converting the audio signal into a plurality of sound intensity values;

capturing an ambient noise signal;

smoothing the captured audio signal to attenuate one or more signal distortions, the smoothing comprising:

dividing the captured audio signal into a plurality of blocks;

determining a plurality of mean audio signal intensities corresponding to the plurality of blocks; and adjusting the audio signal to produce a smoothed captured audio signal based on the determined plurality of mean audio signal intensities, said adjusting comprising subtracting each of the mean audio signal intensities from sample values of a corresponding one of the plurality of blocks;

smoothing the ambient noise signal to produce a smoothed noise signal;

subtracting the smoothed noise signal from the smoothed captured audio signal to produce a corrected smoothed signal;

clipping the corrected smoothed signal to produce a clipped smoothed signal;

determining, based at least in part on the clipped smoothed signal, one or more frequency response correction parameters, the one or more frequency response correction parameters comprising finite impulse response filter parameters; and electronically transmitting the one or more frequency response correction parameters to the electronic device, thereby enabling the electronic device to apply the one or more frequency response correction parameters to a subsequent audio signal, wherein at least said smoothing is performed by one or more processors.

2. The method of claim 1, wherein dividing the captured audio signal into the plurality of blocks further comprises converting the captured audio signal into a frequency domain.

3. The method of claim 2, further comprising multiplying the plurality of blocks of the captured audio signal by a window prior to converting the captured audio signal into the frequency domain.

4. The method of claim 3, wherein the window comprises an overlapping window selected from the group consisting of a Hanning window, Hamming window, Tukey window, Cosine window, Lanczos window, and Triangular window.

5. The method of claim 1, wherein smoothing the captured audio signal further comprises:

for each block in the plurality of blocks of the captured audio signal, grouping the sound intensity values into a plurality of frequency bands, determining a plurality of first mean sound intensity values corresponding to the plurality of frequency bands; and adjusting the captured audio signal based on the determined plurality of first mean sound intensity values.

6. The method of claim 5, wherein adjusting the captured audio signal comprises, for each frequency band in the plurality of frequency bands, setting the sound intensity values associated with a frequency band to the first mean sound intensity value corresponding to the frequency band.

7. The method of claim 5, wherein grouping the sound intensity values into the plurality of frequency bands comprises performing a nonlinear grouping.

8. The method of claim 7, wherein the nonlinear grouping comprises grouping according to a logarithmic spacing along a frequency axis.

9. The method of claim 5, wherein smoothing the captured audio signal further comprises:

determining a plurality of second mean sound intensity values corresponding to a sound intensity value and one or more neighboring sound intensity values; and adjusting the captured audio signal based on the determined plurality of second mean sound intensity values.

10. The method of claim 9, wherein adjusting the captured audio signal comprises setting a sound intensity value to the corresponding second mean sound intensity value.

11. The method of claim 9, wherein a number of neighboring sound intensity values in the one or more neighboring sound intensity values is determined nonlinearly.

12. The method of claim 1, wherein determining the one or more frequency response correction parameters further comprises determining infinite impulse response filter parameters.

13. The method of claim 1, wherein the audio signal comprises pink noise.

14. The method of claim 1, wherein the one or more processors are configured to output a user interface comprising functionality that enables a user to adjust one or more parameters associated with smoothing the captured audio signal.

15. An apparatus for correcting frequency response of an electronic device, the apparatus comprising:

a correction determination module comprising one or more processors, the correction determination module configured to:

convert an audio signal into a plurality of sound intensity values;

smooth the audio signal to attenuate one or more signal distortions to produce a smoothed audio signal by at least: dividing the audio signal into a plurality of blocks, determining a plurality of mean audio signal intensities corresponding to the plurality of blocks, and adjusting the audio signal to produce a smoothed captured audio signal based on the determined plurality of mean audio signal intensities;

smooth an ambient noise signal to produce a smoothed noise signal;

subtract the smoothed noise signal from the smoothed captured audio signal to produce a corrected smoothed signal;

receive correction input from a user, the correction input comprising one or more parameters for a magnitude correction of at least a portion of the frequency response of the smoothed audio signal;

calculate, based at least in part on the corrected smoothed signal and the correction input, one or more frequency response correction parameters; and provide the one or more frequency response correction parameters to the electronic device.

16. The apparatus of claim 15, wherein dividing the audio signal into the plurality of blocks further comprises converting the audio signal into a frequency domain.

17. The apparatus of claim 15, wherein the correction determination module is further configured to smooth the audio signal by:

for each block in the plurality of blocks of the audio signal, grouping the sound intensity values into a plurality of frequency bands, determining a plurality of first mean sound intensity values corresponding to the plurality of frequency bands; and adjusting the audio signal based on the determined plurality of first mean sound intensity values.

18. The apparatus of claim 17, wherein adjusting the audio signal comprises for each frequency band in the plurality of frequency bands, setting the sound intensity values associated with a frequency band to the first mean sound intensity value corresponding to the frequency band.

19. The apparatus of claim 17, wherein grouping the sound intensity values into the plurality of frequency bands comprises performing a nonlinear grouping.

20. The apparatus of claim 19, wherein the nonlinear grouping comprises grouping according to a logarithmic spacing along a frequency axis.

21. The apparatus of claim 17, wherein the correction determination module is further configured to smooth the audio signal by:

determining a plurality of second mean sound intensity values corresponding to a sound intensity value and one or more neighboring sound intensity values; and adjusting the audio signal based on the determined plurality of second mean sound intensity values.

22. The apparatus of claim 21, wherein adjusting the audio signal comprises setting a sound intensity value to the corresponding second mean sound intensity value.

23. The apparatus of claim 21, wherein a number of neighboring sound intensity values in the one or more neighboring sound intensity values is determined nonlinearly.

24. The apparatus of claim 15, wherein the correction determination module is further configured to determine at least one of finite impulse response filter parameters and infinite impulse response filter parameters.

* * * * *